United States Patent [19]
Chevallier et al.

[11] Patent Number: 5,694,366
[45] Date of Patent: Dec. 2, 1997

[54] OP AMP CIRCUIT WITH VARIABLE RESISTANCE AND MEMORY SYSTEM INCLUDING SAME

[75] Inventors: Christophe J. Chevallier, Palo Alto; Michael S. Briner, San Jose, both of Calif.

[73] Assignee: Micron Quantum Devices, Inc., Santa Clara, Calif.

[21] Appl. No.: 640,456

[22] Filed: May 1, 1996

[51] Int. Cl.$^6$ ............................. G11C 7/02; H03G 3/12
[52] U.S. Cl. ...................... 365/207; 365/208; 330/282; 330/86
[58] Field of Search ...................... 365/207, 208, 365/185.21; 330/86, 144, 282, 284

[56] References Cited

U.S. PATENT DOCUMENTS

| 5,387,879 | 2/1995 | Satoh | 330/282 |
|---|---|---|---|
| 5,487,045 | 1/1996 | Trodden | 365/205 |
| 5,523,721 | 6/1996 | Segawa | 330/86 |
| 5,579,274 | 11/1996 | Van Buskirk | 365/208 |
| 5,581,213 | 12/1996 | Linder | 330/282 |

Primary Examiner—David C. Nelms
Assistant Examiner—Son Mai
Attorney, Agent, or Firm—Limbach & Limbach LLP

[57] ABSTRACT

An operational amplifier-based voltage multiplier circuit ("op amp circuit") implemented as an integrated circuit, and a memory chip including such an op amp circuit. The op amp circuit includes a variable operational feedback or input resistance (or a variable operational feedback resistance and a variable input resistance), and preferably also circuitry for controlling at least one variable resistance in response to control bits to cause the op amp circuit to assert a selected output voltage in response to a given input voltage. Preferably, each set of control bits determines a binary control word whose binary value has a simple functional relation to the value of the output voltage selected thereby. Preferably, the memory chip includes an array of memory cells (e.g., flash memory cells) and a control unit for controlling memory operations including programming, reading, and erasing the memory cells. The op amp circuit outputs each selected output voltage in response to a different binary control word asserted by the control unit. Each binary control word is preferably determined by a set of control bits whose binary value has a simple functional relation to the value of the output voltage selected thereby. The memory chip preferably includes non-volatile data storage units which store bits of the binary control words.

45 Claims, 8 Drawing Sheets

OP AMP CIRCUIT WITH VARIABLE RESISTANCE AND MEMORY SYSTEM INCLUDING SAME

BACKGROUND OF THE INVENTION

1. Field of the Invention

The invention relates to an operational amplifier-based voltage multiplier circuit (implemented as an integrated circuit) having variable operational feedback or series input resistance, and preferably control circuitry for controlling the resistance to cause the circuit to assert a desired output voltage in response to a given input voltage. In a class of embodiments, the invention is an integrated memory circuit including an operational amplifier-based circuit of this type for asserting a desired output voltage for use in memory operations (e.g., for use as a reference voltage by a sense amplifier in reading one or more cells of a memory array).

2. Description of Related Art

Operational amplifiers (op amps) having conventional design have been used in many circuits, including integrated circuits. It is well known to construct a noninverting amplifier by connecting an operational feedback resistor between the output terminal of an op amp and a first input terminal of the op amp, and also connecting a second resistor (a series input resistor) between the first input terminal and ground. With such operational feedback resistor and series input resistor connected to the op amp as described (because the input impedance at each input terminal of the op amp is extremely high), the output voltage (Vout) at the output terminal of the op amp is (to a good approximation): Vout=[(R1+R2)/R2]Vref, where input voltage Vref is asserted to the non-inverting input terminal of the op amp, R1 is the resistance of the operational feedback resistor, R2 is the resistance of the series input resistor, and the inverting input terminal of the op amp is connected to ground through the series input resistor.

One aspect of the invention is an improved integrated circuit implementation of an op amp circuit including a variable operational feedback resistor (or a variable series input resistor), and control circuitry for controlling the variable resistance to cause the op amp circuit to assert a selected output voltage in response to a given input voltage and control bits. In preferred embodiments, each set of control bits determines a binary control word whose binary value has a simple functional relation to the value of the output voltage selected thereby.

It is also well known to implement a memory chip to include an array of memory cells arranged in rows and columns, and a control means for controlling memory operations (including the operations of programming, reading, and erasing the memory cells). It is also known to implement such a memory chip with non-volatile data storage units such as those described in U.S. patent application Ser. No. 08/508,864, entitled NON-VOLATILE DATA STORAGE UNIT AND METHOD OF CONTROLLING SAME, filed Jul. 28, 1995, in U.S. patent application Ser. No. 08/508,921, entitled MEMORY SYSTEM HAVING PROGRAMMABLE FLOW CONTROL REGISTER, filed Jul. 28, 1995, and in U.S. patent application Ser. No. 08/508,923, entitled MEMORY SYSTEM HAVING NON-VOLATILE DATA STORAGE STRUCTURE FOR MEMORY CONTROL PARAMETERS AND METHOD, filed Jul. 28, 1995, the contents of each of which are incorporated herein by reference. Such non-volatile data storage units can store control parameter data used by the control means for controlling memory operations. The control parameter data can include data determining parameters for adjusting the magnitude and duration of voltage pulses applied to the memory for carrying out programming and erasing operations, or for adjusting the magnitude of a reference voltage supplied to the system's sense amplifiers. The control parameter data are preferably stored in data storage structures which are separate from the array of memory cells. The data storage structures preferably include a data storage unit for storing each of the control parameters.

It would be desirable to include an op-amp-based voltage source in a memory chip, if such voltage source were designed to be controllable to output any of a variety of selected, stable output voltages. It would also be desirable to design such a variable voltage source to be efficiently controllable to output each of the selected output voltages in response to a different binary control word (preferably with the selected output voltage having a simple functional relation to the binary value of the control word).

Another aspect of the invention is a memory chip including an op amp circuit (including a variable operational feedback resistor or variable series input resistor) and means for controlling the variable resistance of the op amp circuit to cause the op amp circuit to assert a selected one of a set of output voltages for use in one or more memory operations. The op amp circuit outputs each selected output voltage in response to a different binary control word. The memory chip preferably includes non-volatile data storage units which store bits of the binary control words. In preferred embodiments in which the memory chip includes a sense amplifier, the sense amplifier uses each selected output voltage asserted by the op amp circuit as a reference voltage during reading, programming, or erasing of all or some cells of a memory array.

SUMMARY OF THE INVENTION

In a class of embodiments, the invention is an operational amplifier-based voltage multiplier circuit ("op amp circuit") implemented as an integrated circuit, including a variable operational feedback or input resistance (or both a variable operational feedback and a variable input resistance), and preferably also including control circuitry for controlling the variable resistance in response to one or more control bits to cause the op amp circuit to assert a selected output voltage in response to a given input voltage. In preferred embodiments, any of several different sets of control bits can be asserted to the op amp circuit when desired, and each set of control bits determines a binary control word whose binary value has a simple functional relation to the value of the output voltage selected thereby. Examples of such "simple" functional relations are increasing functional relations (according to which increasing binary values determine increasing output voltages, such as linearly or exponentially increasing output voltages) or decreasing functional relations (according to which increasing binary values determine decreasing output voltages, such as linearly decreasing output voltages, exponentially decreasing output voltages, or output voltages which are inversely proportional to the increasing binary values).

In alternative embodiments, two or more sets of control bits are asserted simultaneously to the op amp circuit, and the op amp circuit selectively responds to only a selected one of these sets (by asserting corresponding control bits to a variable resistance thereof). In the latter alternative embodiments, each selected set of control bits preferably determines a binary control word whose binary value has a simple functional relation to the value of the output voltage selected thereby.

In another class of embodiments, the invention is an integrated memory circuit (memory chip) including an op amp circuit designed in accordance with the invention. The chip includes means for controlling the variable resistance of the op amp circuit by asserting control bits thereto, to cause the op amp circuit to assert a selected output voltage for use in at least one memory operation (e.g., as a reference voltage by a sense amplifier in reading one or more memory array cells, or as a word line voltage during healing or reading of at least one memory array cell). Preferably, the memory chip includes an array of memory cells (preferably flash memory cells) arranged in rows and columns, with each cell in one of the rows being coupled to a common word line and each cell in one of the columns being coupled to a common bit line. The chip includes a control unit for controlling memory operations including programming, reading, and erasing the memory cells. The op amp circuit outputs each selected output voltage in response to a different binary control word asserted by the control unit. The memory chip preferably includes non-volatile data storage units which store bits of the control words, with the data storage units implemented in a data storage structure separate from the array of memory cells.

In some preferred embodiments, the memory chip includes a sense amplifier which uses each selected output voltage asserted by the op amp circuit as a reference voltage during reading, programming, or erasing of all or some of the memory cells. Preferably, each set of control bits determines a binary control word whose binary value has a simple functional relation to the value of the output voltage selected thereby. In some embodiments, the memory chip asserts two or more sets of control bits simultaneously to the op amp circuit, and the op amp circuit selectively responds to only a selected one of these sets (by asserting corresponding control bits to a variable resistance thereof).

BRIEF DESCRIPTION OF THE DRAWINGS

FIG. 4 shows that output voltage $V_{out}$ increases faster than linearly (according to:

$V_{out}=[(R1+R2_f+R2_v)V_{ref}]/(R2_f+R2_v))$ as $R2_v$ decreases linearly and $V_{ref}$, R1, and $R2_f$ remain fixed.

Figure 2:
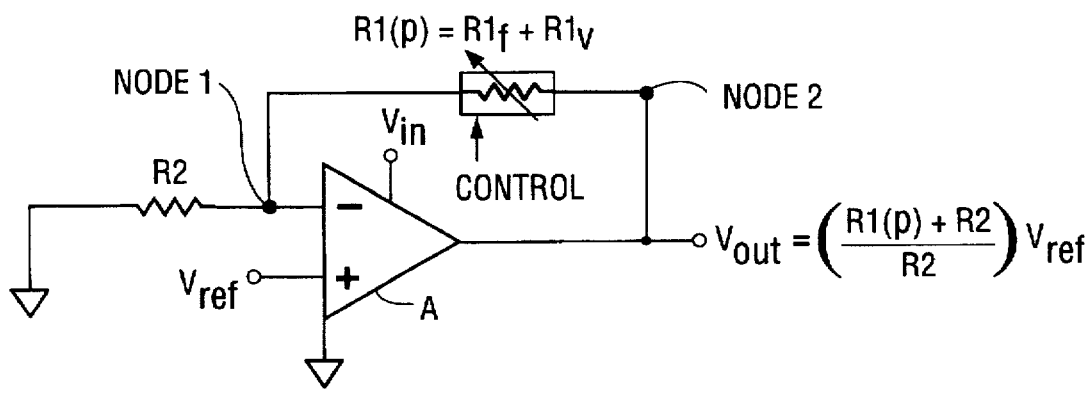
FIG. 2 is a schematic diagram of a second embodiment of the op amp circuit of the invention.
Figure 5:
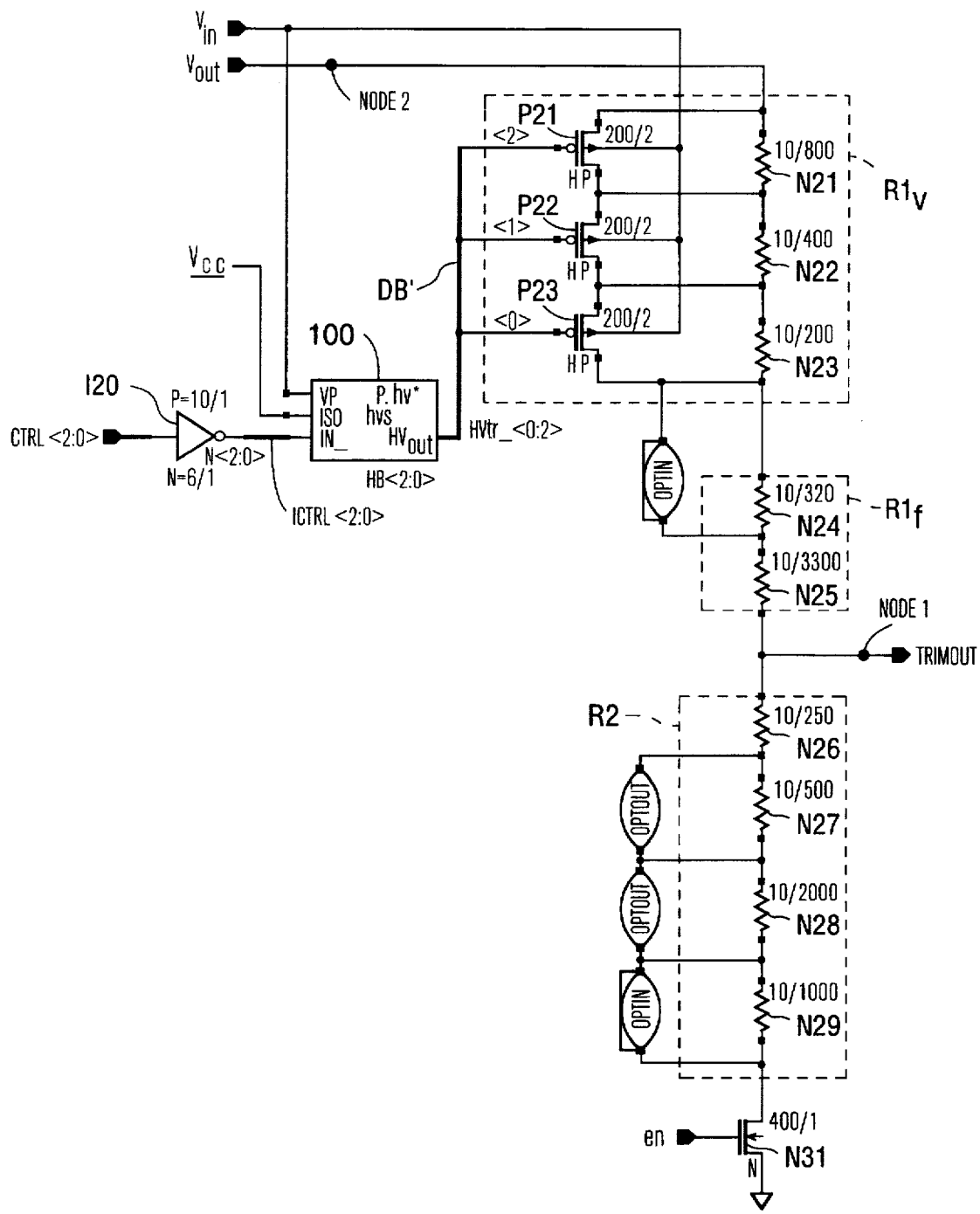

FIG. 5 is a schematic diagram of preferred implementation of a portion of the FIG. 2 circuit (showing parameters of a preferred integrated circuit implementation thereof).

Figure 6:
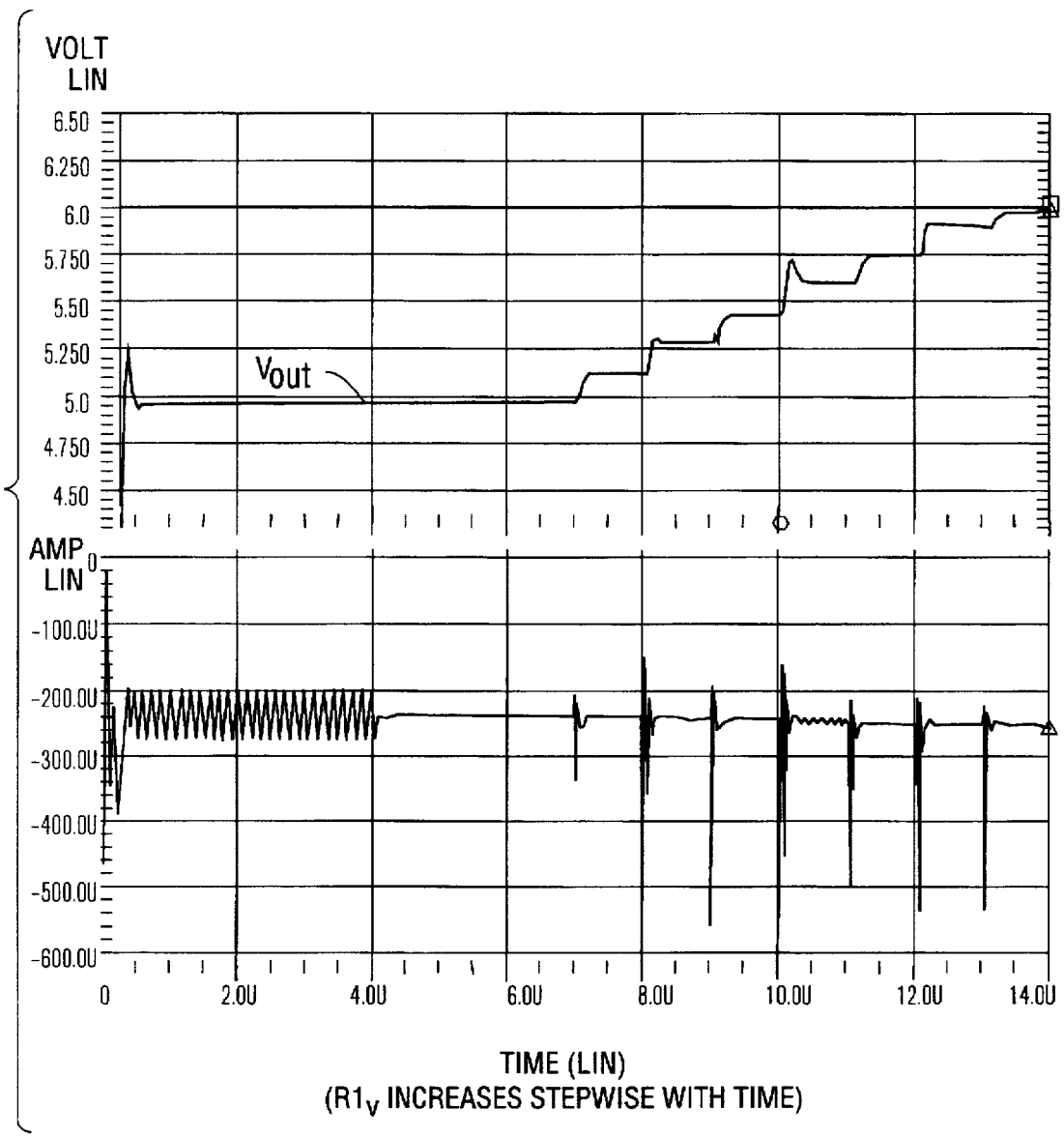

FIG. 6 is a graph of output voltage $V_{out}$ of FIG. 2 (for fixed input voltage $V_{ref}$ and fixed supply voltage $V_{in}$) versus variable resistance $R1_v$, as resistance $R1_v$ increases stepwise with time. FIG. 6 shows that output voltage $V_{out}$ increases linearly according to:

$V_{out}=[(R1_f+R1_v+R2)V_{ref}]/R2$, as $R1_v$ increases linearly and $V_{ref}$, $R1_f$, and R2 remain fixed.

Figure 7:
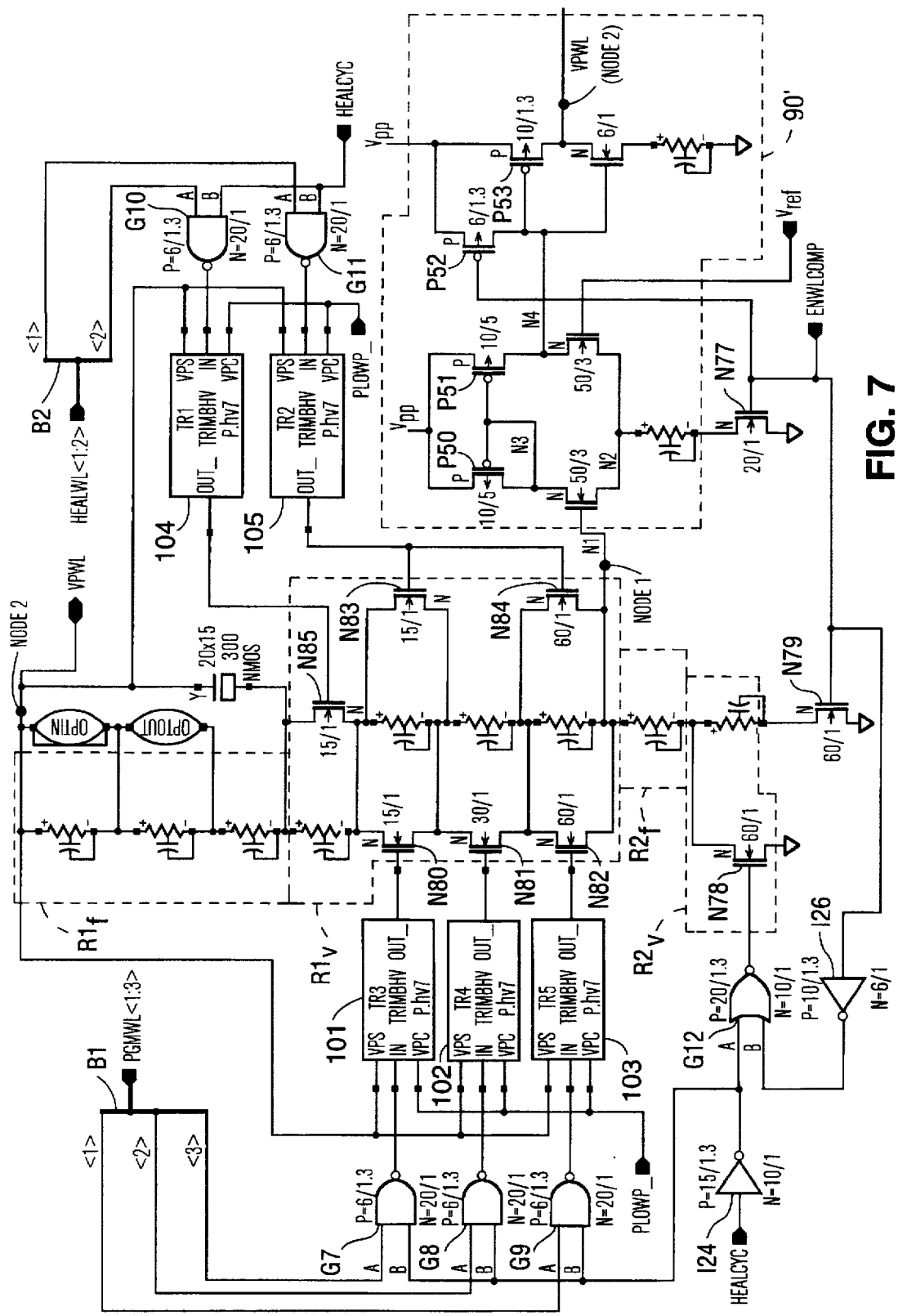

FIG. 7 is a schematic diagram of an alternative embodiment of the inventive op amp circuit.

Figure 8:
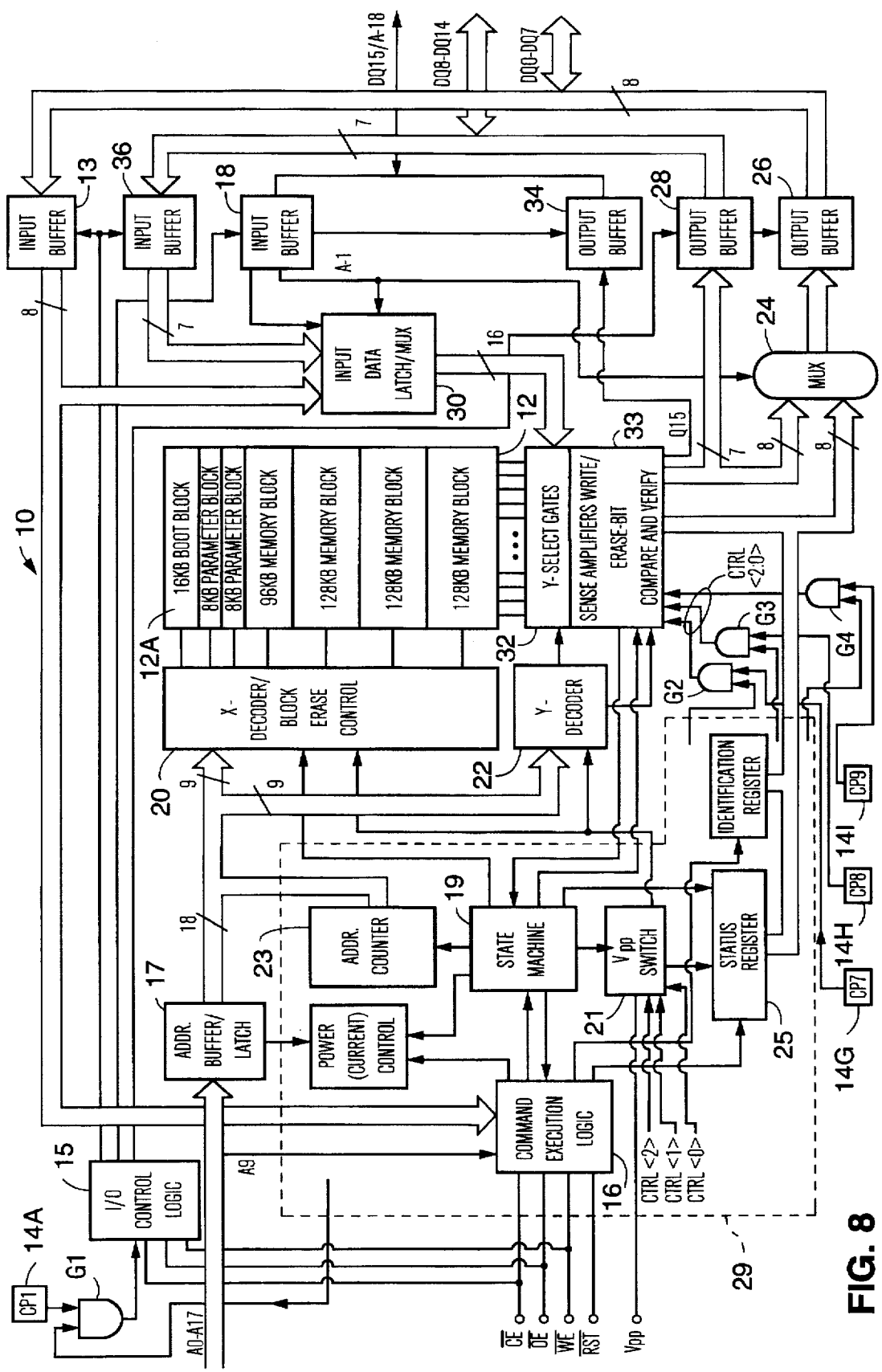

FIG. 8 is a block diagram of a memory system which embodies the present invention.

Figure 9:
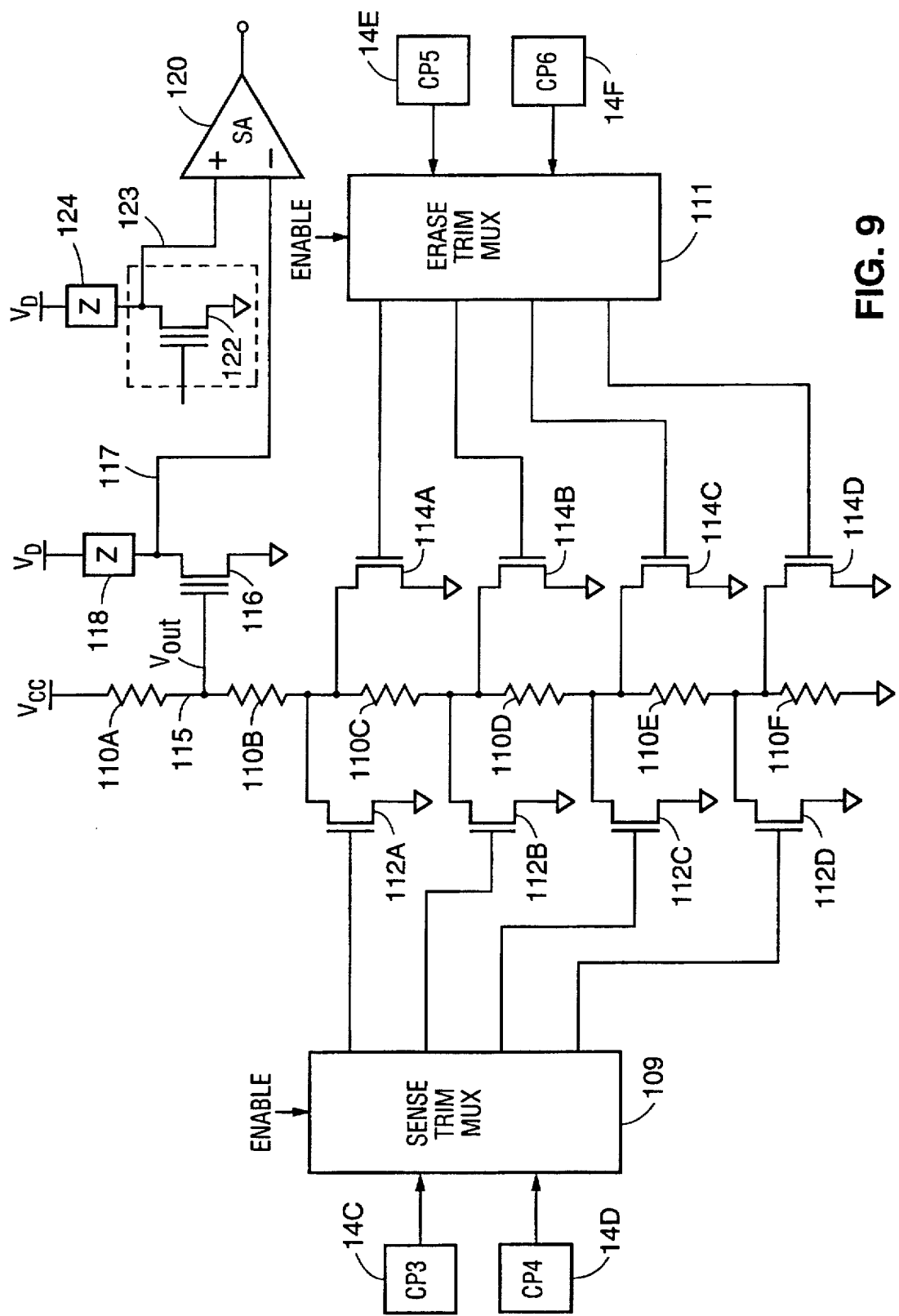

FIG. 9 is a schematic diagram of a circuit (which does not embody the invention) for supplying a selected reference voltage to a sense amplifier.

DETAILED DESCRIPTION OF THE INVENTION

Figure 1:
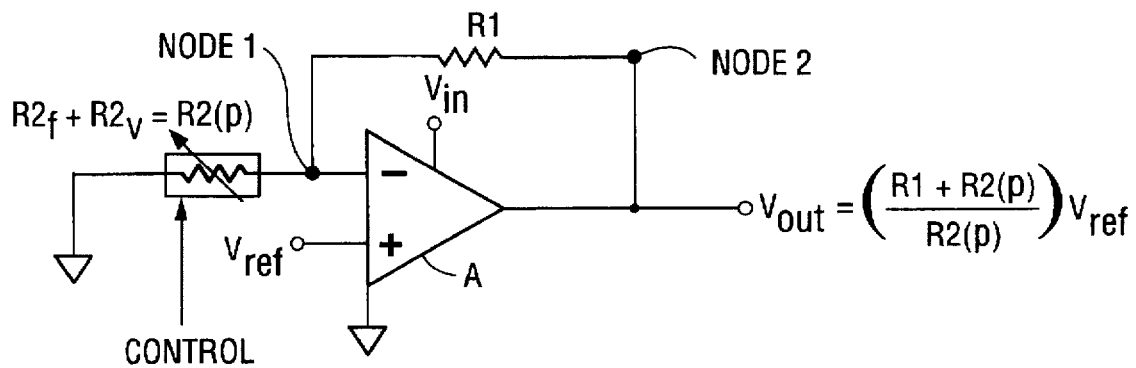
FIG. 1 is schematic diagram of a first embodiment of the op amp circuit of the invention.

FIG. 1 is a schematic diagram of a first embodiment of the invention, which includes op amp A having supply voltage $V_{in}$, variable input resistor R2 (connected between ground and a first input of op amp A), and fixed operational feedback resistor R1 (connected as shown between the first input and the output of op amp A). The resistance of variable resistor R2 is $R2_f+R2_v$, where $R2_f$ is fixed and $R2_v$ has one of N selectable values. Because $R2_v$ can vary in response to control parameters (control bits), R2 is denoted as R2(p) in FIG. 1. Each value of variable resistance $R2_v$ is determined by supplying to resistor R2 one of N different control or "trim" signals (denoted as "Control" in FIG. 1). Each of the control signals is preferably a set of one or more binary control bits (in the sense that each control signal is an electrical signal, and the electric signal is preferably indicative of a set of one or more binary control bits).

In the FIG. 1 circuit, the output voltage $V_{out}$ of op amp A is related to the input voltage $V_{ref}$ at one input terminal of op amp A by:

$V_{out}=[(R1+R2_f+R2_v)V_{ref}]/(R2_f+R2_v)$.

Thus, as $R2_v$ decreases linearly and $V_{ref}$, R1, and $R2_f$ remain fixed, the value of $V_{out}$ increases nonlinearly. Output voltage $V_{out}$ does not depend on variations in a supply voltage ($V_{cc}$ or $V_{in}$), and can have any value in a range from the reference voltage $V_{ref}$ to the supply voltage $V_{in}$.

FIG. 2 is a schematic diagram of a second embodiment of the invention, including op amp A (having supply voltage $V_{in}$), fixed resistor R2, and variable operational feedback resistor R1 connected as shown. The resistance of variable resistor R1 is $R1_f+R1_v$, where $R1_f$ is fixed and $R1_v$ has one of N selectable values. The value of variable resistance $R1_v$ is determined by supplying to resistor R1 one of N different control or "trim" signals (denoted as "Control" in FIG. 2). Each of the control signals is preferably a set of one or more binary control bits (in the sense that each control signal is an electrical signal, and the electric signal is preferably indicative of a set of one or more binary control bits).

In the FIG. 2 circuit, the output voltage $V_{out}$ of op amp A is related to the input voltage $V_{ref}$ at one input terminal of op amp A by:

$V_{out}=[(R2+R1_f+R1_v)V_{ref}]/R2$.

Thus, as $R1_v$ increases linearly and $V_{ref}$, R2, and $R1_f$ remain fixed, the value of $V_{out}$ increases linearly. Output voltage $V_{out}$ does not depend on variations in a supply voltage ($V_{cc}$ or $V_{in}$), and can have any value in a range from the reference voltage $V_{ref}$ to the supply voltage $V_{in}$.

Figure 3:
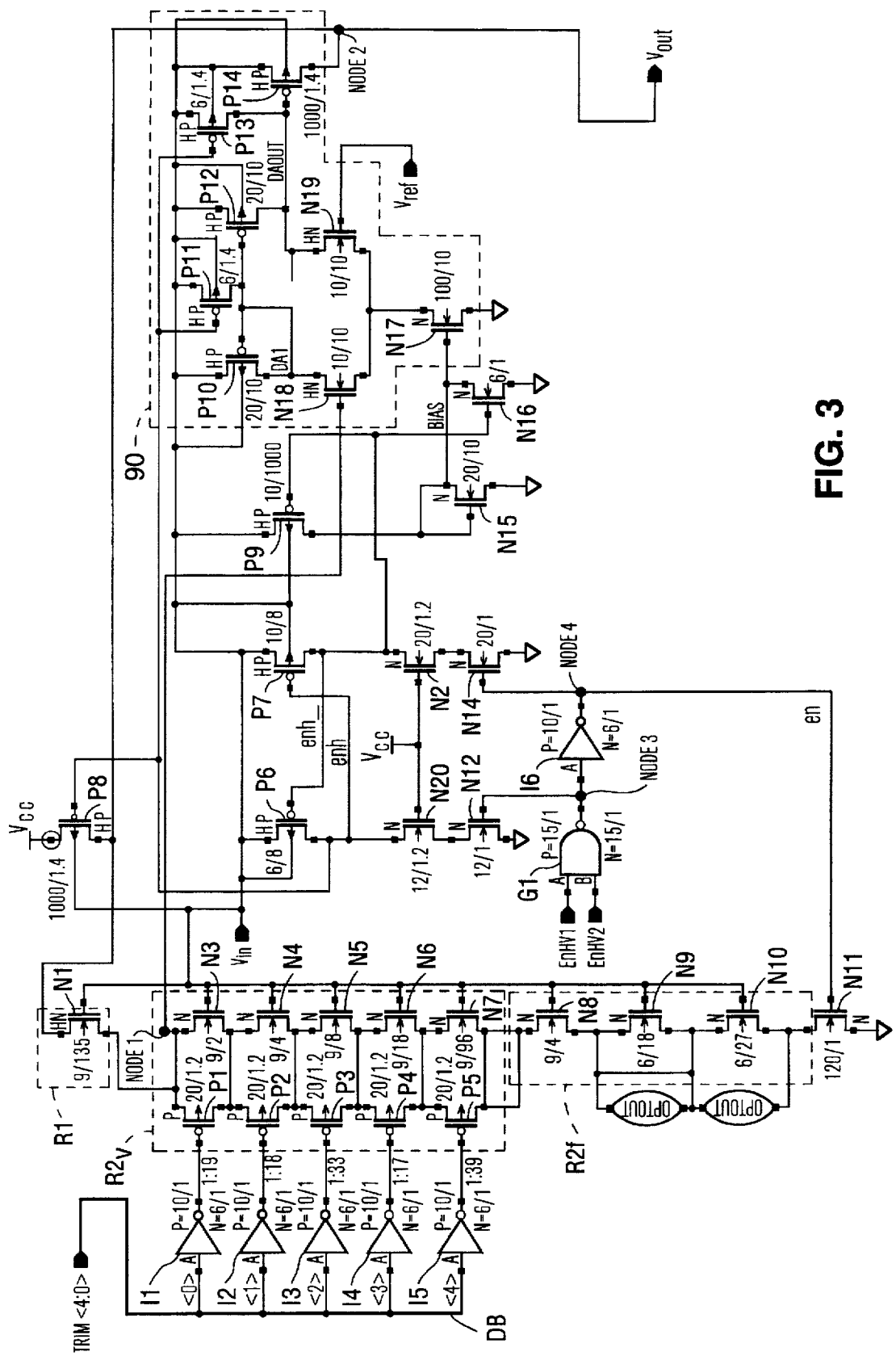
FIG. 3 is a schematic diagram of preferred implementation of the FIG. 1 circuit (showing parameters of a preferred integrated circuit implementation thereof).

FIG. 3 is a schematic diagram of preferred implementation of the FIG. 1 circuit. N-channel MOS transistor N1 (connected as shown in FIG. 3) implements resistor R1 of FIG. 1. P-channel MOS transistors P1, P2, P3, P4, and P5 and N-channel MOS transistors N3, N4, N5, N6, and N7 (connected with their channel terminals, i.e., their sources and drains, connected in series as shown in FIG. 3) implement variable resistor portion $R2_v$ of resistor R2 of FIG. 1. N-channel MOS transistors N8, N9, N10, and N11 (connected as shown in FIG. 3) implement fixed resistor portion $R2_f$ of resistor R2. "Node 1" indicated in FIG. 3 corresponds to Node 1 of FIG. 1, and "Node 2" indicated in FIG. 3 corresponds to Node 2 of FIG. 1.

As indicated in FIG. 3, the parameters (including channel length-to-width ratio of each transistor in an integrated circuit implementation of the FIG. 3 circuit) of transistors N3, N4, N5, N6, and N7 are chosen so that (and the transistors are operated in a region in which) each has a different resistance (defined as Vsd/Isd, where Vsd is the potential difference between the source and drain, and Isd is the current between the source and drain). Preferably these parameters are chosen so that in operation of the FIG. 3 circuit (with supply voltages to be discussed below asserted thereto), the resistance of transistor N3 is half that of transistor N4, the resistance of N4 is half that of N5, the resistance of N5 is half that of N6, and the resistance of N6 is half that of N7, and the resistance of each of transistors P1, P2, P3, P4, P5 is much lower than the resistance of any of transistors N3, N4, N5, N6 and N7. The advantage of choosing the resistances in this way is to enable convenient stepwise control of the overall resistance of variable resistor portion R2$_v$, in the sense explained below.

In variations on the FIG. 3 embodiment, a passive resistor replaces each of transistors N3, N4, N5, N6, and N7. It is contemplated that the variable resistor portion of the op amp circuit of the invention can be implemented with series connected resistive elements which are either active elements (each having a resistance in operation) or passive resistive elements. In the claims, the term "resistor" is used in a broad sense to denote either an active resistive element or a passive resistive element (except that the expression "passive resistor" denotes a passive resistive element only). We contemplate that in many applications of the inventive op amp circuit, it will be preferable to implement the variable resistor portion with series-connected passive resistors (such as passive resistors N21, N22, and N23 of FIG. 5) rather than series-connected active resistive elements (such as transistors N3, N4, N5, N6, and N7 of FIG. 3 having channel terminals connected in series).

With reference again to FIG. 3, in response to the bits of a 5-bit control word TRIM<4:0> received on bus DB, each of transistors P1, P2, P3, P4, and P5 is selectively turned on or off. The most significant bit (identified as "<0>") of control word TRIM<4:0> is inverted in inverter I1 and the inverted bit is supplied to the gate of transistor P1. Similarly, the second most significant bit ("<1>") of TRIM<4:0> is inverted in inverter I2 and this inverted bit is supplied to the gate of transistor P2, the third most significant bit ("<2>") of TRIM<4:0> is inverted in inverter I3 and this inverted bit is supplied to the gate of transistor P3, the fourth most significant bit ("<3>") of TRIM<4:0> is inverted in inverter I4 and this inverted bit is supplied to the gate of transistor P4, and the fifth most significant bit ("<4>") of TRIM<4:0> is inverted in inverter I5 and this inverted bit is supplied to the gate of transistor P5. When bit <0> is low, transistor P1 is off and current flows through transistor N3, when bit <0> is high, transistor P1 is on and the current flow through transistor N3 is significantly less than the current through P1, when bit <1> is low, transistor P2 is off and current flows through transistor N4, when bit <1> is high, transistor P2 is on and the current flow through transistor N4 is significantly less than the current through P2, when bit <2> is low, transistor P3 is off and current flows through transistor N5, when bit <2> is high, transistor P3 is on and the current flow through transistor N5 is significantly less than the current through P3, when bit <3> is low, transistor P4 is off and current flows through transistor N6, when bit <3> is high, transistor P4 is on and the current flow through transistor N6 is significantly less than the current through P4, when bit <4> is low, transistor P5 is off and current flows through transistor N7, and when bit <4> is high, transistor P5 is on and the current flow through transistor N7 is significantly less than the current through P5. Thus, there are thirty-two possible values of overall resistance of variable resistor portion R2$_v$ (depending on which combination of transistors P1, P2, P3, P4, and P5 is on).

To increase the overall resistance of portion R2$_v$ linearly (in stepwise fashion) from the minimum resistance value (which occurs when the five bits of control word TRIM<4:0> are 11111) to the maximum resistance value (which occurs when the five bits of control word TRIM<4:0> are 00000), the binary value of the five bits of control word TRIM<4:0> is decreased sequentially (so that the values of these five bits are consecutively: 11111, 11110, 11101, 11100, . . . , 00000).

However, the output voltage V$_{out}$ at Node 2 of FIG. 3 (for fixed input voltage V$_{ref}$ and fixed supply voltage V$_{in}$) increases faster than linearly according to: V$_{out}$=[(R1+R2$_f$+R2$_v$)V$_{ref}$]/(R2$_f$+R2$_v$), as R2$_v$ decreases (and R1 and R2$_f$ remain fixed). Thus, the output voltage V$_{out}$ at Node 2 of FIG. 3 (for fixed input voltage V$_{ref}$ and fixed supply voltage V$_{in}$) increases (stepwise) faster than linearly as the binary value of the five bits of control word TRIM<4:0> is increased sequentially (e.g., from 00000 to 00001 to 00010 to 00011, and so on).

There is a simple functional relation between the binary value of the bits of control word TRIM<4:0> and the value of V$_{out}$, for a given set of parameters R1, R2$_f$, and V$_{ref}$. If the binary value of control word TRIM<4:0> is normalized by adding 00001 to the bits thereof (to avoid division by the value 00000), this simple functional relation is inverse proportionality. More specifically, the value of V$_{out}$ (minus the offset value V$_{ref}$) is inversely proportional to the binary value of the normalized bits of TRIM<4:0>.

A control unit of a memory circuit can control assertion of each control word TRIM<4:0> of FIG. 3, in a manner to be explained below (e.g., in the manner in which control unit 29 of memory chip 10 of below-discussed FIG. 8 generates such a control word).

Where the resistance of transistor N3 is half that of transistor N4, the resistance of N4 is half that of N5, the resistance of N5 is half that of N6, and the resistance of N6 is half that of N7, and the resistance of each of transistors P1, P2, P3, P4, P5 is much lower than the resistance of any of transistors N3, N4, N5, N6 and N7 (and each bit of TRIM<4:0> is a binary bit), the invention allows convenient stepwise control of the overall resistance of variable resistor portion R2$_v$, with the resistance of transistor N3 being the value of the smallest "step" by which the resistance of R2$_v$ can be increased or decreased.

More generally, in preferred embodiments, any of $2^N$ different sets of control bits can be asserted to the variable resistive element of the inventive op amp circuit (each set consisting of N binary bits asserted in parallel). Considered together, the sets of control bits determine $2^N$ different binary control words.

Figure 4:
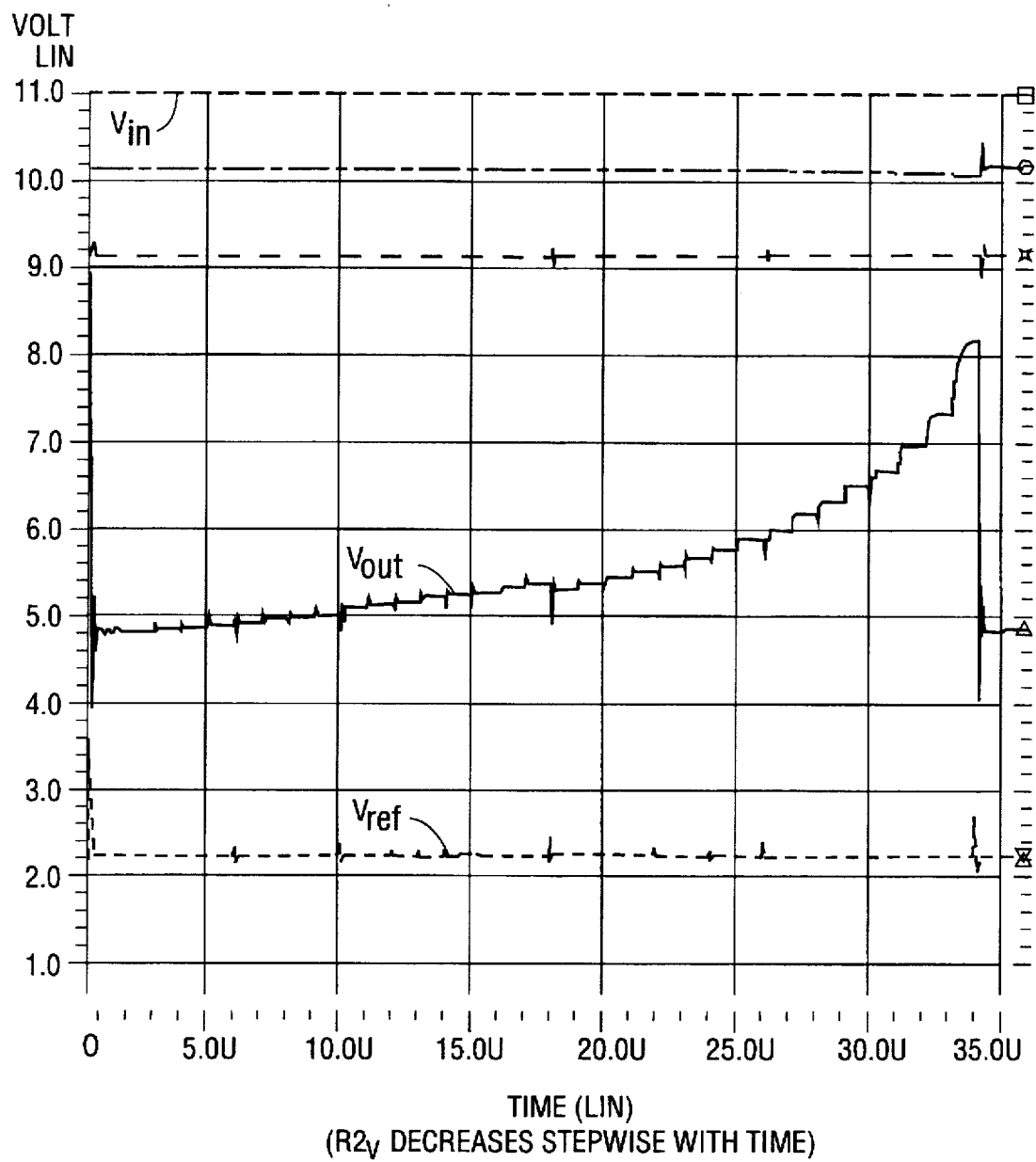
FIG. 4 is a graph of output voltage $V_{out}$ of FIG. 3 (for fixed input voltage $V_{ref}$ substantially equal to 2.2 volts and fixed supply voltage $V_{in}$ substantially equal to 11 volts) versus variable resistance $R2_v$, as resistance $R2_v$ decreases stepwise with time.

As shown in FIG. 4, output voltage V$_{out}$ at Node 2 of FIG. 3 (for fixed input voltage V$_{ref}$ substantially equal to 2.2 volts, and fixed supply voltage V$_{in}$ substantially equal to 11 volts) increases stepwise (faster than linearly with time, according to: V$_{out}$=[(R1+R2$_f$+R2$_v$)V$_{ref}$]/(R2$_f$+R2$_v$)) as resistance R2$_v$ decreases linearly (stepwise) and R1 and R2$_f$ remain fixed.

The FIG. 3 circuit is disabled or enabled in response to control signals EnHV1 and EnHV2. It is disabled when at least one of signals EnHV1 and EnHV2 is low (has a voltage level corresponding to a logical value "0"), and when disabled, it draws substantially no current even when input voltage $V_{ref}$ and supply voltages $V_{in}$ and $V_{cc}$ are supplied thereto at the nodes indicated in FIG. 3). The FIG. 3 circuit is enabled when signals EnHV1 and EnHV2 are both high (have voltage levels corresponding to a logical value "1"), and when enabled, its output voltage at Node 2 is $V_{out}=[(R1+R2_f+R2_v)V_{ref}]/(R2_f+R2_v)$, provided that appropriate supply voltages $V_{in}$ and $V_{cc}$ are supplied thereto at the nodes indicated in FIG. 3.

Supply voltage $V_{in}$ is provided to the source of each of transistors P6, P7, P9, P10, P11, P12, P13, and P14 as shown in FIG. 3. Supply voltage $V_{cc}$ is provided to the source of transistor P8 and to the gate of each of N-channel MOS transistors N20 and N2 as shown in FIG. 3. Typically, supply voltage $V_{in}$ is equal to about 10 or 11 volts (above ground), and supply voltage $V_{cc}$ typically has a value in the range from about 3 to 5 volts (above ground).

Control signals EnHV1 and EnHV2 are received at the inputs of NAND gate G1. The output of gate G1 (at Node 3 of FIG. 3) is inverted by inverter I6. The output of inverter I6 is Node 4 of FIG. 3. To disable the circuit, at least one of signals EnHV1 and EnHV2 is low, to cause Node 3 to be high and Node 4 to be low. In this state, N-channel MOS transistors N11, N14, N15, and N17 are off, P-channel MOS transistors P6 and P9 are off, N-channel MOS transistor N12 is on, and P-channel MOS transistors P7, P8, and P11 are on. As a result, circuit portion 90 is disabled (circuit portion 90 is an op amp circuit comprising P-channel MOS transistors P10, P11, P12, P13, and P14 connected as shown and N-channel MOS transistors N17, N18, and N19 connected as shown).

To enable the FIG. 3 circuit, signals EnHV1 and EnHV2 are both set to be high, so that Node 3 is low and Node 4 is high. In this state, N-channel MOS transistors N11, N14, N15, and N17 are on, P-channel MOS transistors P6 and P9 are on, transistor N12 is off, and transistors P7 and P8 are off. As a result, circuit portion 90 operates in a conventional manner as an op amp to assert the following output voltage at Node 2: $V_{out}=[(R1+R2_f+R2_v)V_{ref}]/(R2_f+R2_v)$, provided that appropriate supply voltages $V_{in}$ and $V_{cc}$ are supplied thereto at the nodes indicated in FIG. 3.

FIG. 5 is a schematic diagram of a preferred implementation of a portion of the FIG. 2 circuit. Passive resistors N21, N22, and N23 and P-channel MOS transistors P21, P22, and P23 (connected as shown in FIG. 5) implement variable resistor portion $R1_v$ of resistor R1 of FIG. 2. Passive resistors N24 and N25 (connected as shown in FIG. 5) implement fixed resistor portion $R1_f$ of resistor R1. Passive resistors N26, N27, N28, and N29 (connected as shown in FIG. 5) implement fixed resistor R2. "Node 1" indicated in FIG. 5 corresponds to Node 1 of FIG. 2, and "Node 2" indicated in FIG. 5 corresponds to Node 2 of FIG. 2.

As indicated in FIG. 5, the resistance of each of resistors N21, N22, and N23 is chosen so that in operation of the FIG. 5 circuit (with supply voltages to be discussed below asserted thereto), the resistance of N21 is twice that of N22, the resistance of N22 is twice that of N23, and the resistance of each of transistors P21, P22, and P23 is much lower than the resistance of any of resistors N21, N22, and N23. The advantage of choosing the resistances in this way is to enable convenient stepwise control of the overall resistance of variable resistor portion $R1_v$, in the following sense.

In response to the three bits of 3-bit control word HVtr<2:0> received on bus DB' (bus DB' has a width of three bits), each of transistors P21, P22, and P23 is selectively turned on or off. The most significant bit (identified as "<2>") of control word HVtr<2:0> is supplied to the gate of transistor P21, the second most significant bit ("<1>") of HVtr<2:0> is supplied to the gate of transistor P22, and the third most significant bit ("<0>") of HVtr<2:0> is supplied to the gate of transistor P23. When bit <2> is high, transistor P21 is off and current flows through resistor N21, when bit <2> is low, transistor P21 is on and the current through resistor N21 is significantly less than the current through P21, when bit <1> is high, transistor P22 is off and current flows through resistor N22, when bit <1> is low, transistor P22 is on and the current flow through resistor N22 is significantly less than the current through P22, when bit <0> is high, transistor P23 is off and current flows through resistor N23, and when bit <0> is low, transistor P23 is on and the current flow through resistor N23 is significantly less than the current through P23. Thus, there are eight possible values of overall resistance of variable resistor portion $R1_v$ (depending on which combination of transistors P21, P22, and P23 is on).

To increase the overall resistance of portion $R1_v$ linearly (in stepwise fashion) from the minimum resistance value (which occurs when the bits of control word HVtr<2:0> are 000) to the maximum resistance value (which occurs when the bits of control word HVtr<2:0> are 111), the binary value of the bits of control word HVtr<2:0> is increased sequentially (so that the values of these three bits are consecutively: 000, 001, 010, 011, 100, 101, 110, and 111). Where the resistance of N21 is twice that of N22, the resistance of N22 is twice that of N23, and the resistance of each of transistors P21, P22, and P23 is much lower than the resistance of any of resistors N21, N22, and N23 (and each bit of HVtr<2:0> is a binary bit), the invention allows convenient stepwise control of the overall resistance of variable resistor portion $R1_v$, with the resistance of resistor N23 being the value of the smallest "step" by which the resistance of $R1_v$ can be increased or decreased.

The output voltage $V_{out}$ at Node 2 of FIG. 5 (for fixed input voltage $V_{ref}$ and fixed supply voltage $V_{in}$) increases linearly according to: $V_{out}=[(R2+R1_f+R1_v)V_{ref}]/R2$, as $R1_v$ increases linearly (and R2 and $R1_f$ remain fixed). Thus, the output voltage $V_{out}$ at Node 2 of FIG. 5 (for fixed input voltage $V_{ref}$ and fixed supply voltage $V_{in}$) increases (stepwise) linearly as the binary value of the bits of control word HVtr<2:0> is increased sequentially (e.g., from 000 to 001 to 010 to 011, and so on).

FIG. 6 is a graph of output voltage $V_{out}$ of FIG. 5 (for fixed input voltage $V_{ref}$ and fixed supply voltage $V_{in}$ substantially equal to 6 volts) versus variable resistance $R1_v$, as resistance $R1_v$ increases stepwise with time. FIG. 6 shows that output voltage $V_{out}$ increases (stepwise) linearly according to: $V_{out}=[(R1_f+R1_v+R2)V_{ref}]/R2$, as $R1_v$ increases (stepwise) linearly and $V_{ref}$, $R1_f$, and R2 remain fixed.

In FIG. 5, voltage level translator 100 outputs the three parallel bits of control word HVtr<2:0>, in response to the three parallel bits of control word ICTRL<2:0>. Each bit of control word ICTRL<2:0> is generated by inverting a corresponding bit of control word CTRL<2:0> in inverter 120. Typically, each bit of control word CTRL<2:0> and control word ICTRL<2:0> has a voltage level in the range from 0 volts (i.e., ground potential) to about $V_{cc}$. Each bit of control word HVtr<2:0> has a voltage level in the range from 0 volts to $V_{in}$, where $V_{in}$ is a supply voltage which is typically equal to about +10 or +11 volts. Both supply voltage $V_{cc}$ (which typically has a value in the range from about +3 to +5 volts) and supply voltage $V_{in}$ are provided to voltage level translator 100, to enable translator 100 to perform the described voltage level translation.

A control unit of a memory circuit can control assertion of each control word CTRL<2:0> of FIG. 5, in a manner to be explained below (e.g., in the manner in which control unit 29 of memory chip 10 of below-discussed FIG. 8 generates such a control word).

It is contemplated that the FIG. 5 circuit will be implemented as part of a single integrated circuit, along with a complementary portion of the FIG. 3 circuit (that portion of the FIG. 3 circuit other than bus DB, inverters I1–I5, resistors R1, R2$_f$, and R2$_v$, and transistor N11 of FIG. 3). In such an integrated circuit, N-channel transistor N31 of FIG. 5 would replace transistor N11 of FIG. 3, and perform the same function as transistor N11 (the gate of N31 would be connected to Node 4 of the "complementary portion" of the FIG. 3 circuit and would have its gate driven by the output of inverter I6 of FIG. 3). Also in such integrated circuit, Node 1 of FIG. 5 would be connected to Node 1 of the "complementary portion" of the FIG. 3 circuit and Node 2 of FIG. 5 would be connected to Node 2 of the "complementary portion" of the FIG. 3 circuit.

FIG. 7 is an op amp circuit which embodies the invention, which includes: variable operational feedback resistor R1$_f$+R1$_v$ (as in the FIG. 5 and FIG. 2 embodiments); two independently operable control circuits for controlling the variable portion R1$_v$ of the operational feedback resistance; variable input resistor R2$_f$+R2$_v$; a control circuit for controlling the variable portion R2$_v$ of the input resistance; and op amp circuit 90' (which corresponds to, and performs essentially the same function as, circuit 90 of FIG. 3).

One input of op amp 90' is connected to Node 1 of FIG. 7 (which corresponds to Node 1 of FIG. 5. In response to input voltage V$_{ref}$, circuit 90' asserts output voltage VPWL at Node 2 of FIG. 7 (Node 2 of FIG. 7 corresponds to Node 2 of FIG. 5. Output voltage VPWL is [(R1$_f$+R1$_v$+R2$_f$+R2$_v$)V$_{ref}$]/(R2$_f$+R2$_v$).

Variable resistance R1$_v$ is controlled by one of two sets of control bits: a first set of three control bits "PgmWL<1:3>" received in parallel on bus B1; and a second set of two control bits "HealWL<1:2>" received in parallel on bus B2. Variable resistance R2$_v$ is controlled by the control bit output from NOR gate G12.

The FIG. 7 circuit is disabled or enabled in response to control signal "EnWLcomp." It is disabled when signal EnWLcomp is low (has a voltage level corresponding to a logical value "0"), and when disabled, it draws substantially no current even when input voltage V$_{ref}$ and supply voltage V$_{cc}$ is supplied to circuit 90' at the nodes indicated in FIG. 7. The FIG. 7 circuit is enabled when signal EnWLcomp is high (has a voltage level corresponding to a logical value "1"), and when enabled, its output voltage at Node 2 is VPWL=[(R1$_f$+R1$_v$+R2$_f$+R2$_v$)V$_{ref}$]/(R2$_f$+R2$_v$), provided that appropriate supply voltage V$_{cc}$ is supplied thereto at the indicated nodes.

Supply voltage V$_{PP}$ (a voltage always greater than VPWL) is provided to the source of each of P-channel MOS transistors P50, P51, P52, and P53 as shown in FIG. 7.

Control signal EnWLcomp is received at the gates of N-channel MOS transistors N77 and N78, the gate of P-channel MOS transistor P52, and is inverted by inverter I26 and supplied to one input of NOR gate G12. The other input of NOR gate G12 (connected to the output of inverter I24) receives the inverse of control signal HealCyc, and the gate of N-channel MOS transistor N78 is connected to the output of NOR gate G12. To disable the FIG. 7 circuit, signal EnWLcomp is low, turning off transistors N77 and N79 and causing gate G12 to turn off transistor N78. To enable the FIG. 7 circuit, signal EnWLcomp is high and thus turns on transistors N77 and N79.

Control signal HealCyc is provided for selecting either control bits PgmWL<1:3> or control bits HealWL<1:2>. It is contemplated that the FIG. 7 circuit can be included in a flash memory system (e.g., chip 10 of FIG. 8) for generating an output voltage VPWL for controlling the voltage of one or more word lines of an array of flash memory cells. More specifically, the FIG. 7 circuit is preferably included in X decoder 20 of FIG. 8 for asserting a selected value of output voltage VPWL to one or more selected word lines of array 12 (each row of flash memory cells of array 12 is coupled to a common word line), so that the FIG. 7 circuit controls the voltage of each such word line.

When included in a memory system (such as that of FIG. 8), the FIG. 7 circuit could generate voltage VPWL to have a value suitable for performing a heal operation (described below) in response to a high level of HealCyc, and the FIG. 7 circuit could generate voltage VPWL to have a value suitable for performing another operation (e.g., the operation of reading an erased or programmed memory cell) in response to a low level of HealCyc. When HealCyc is high, the FIG. 7 circuit operates in response to control word HealWL<1:2>; when HealCyc is low, the FIG. 7 circuit operates in response to control word PgmWL<1:3>.

When HealCyc is low, each of NAND gates G7, G8, and G9 asserts one of control bits PgmWL<1:3> to one of voltage level translators 101, 102, and 103, and translators 101, 102, and 103 assert the corresponding level-translated bits to the gates of N-channel MOS transistors N80, N81, and N82 of resistor portion R1$_v$ (to control the resistance of resistor portion R1$_v$). Also when HealCyc is low, NAND gates G10 and G11 assert default "1" bits (rather than control bits HealWL<1:2>) to voltage level translators 104 and 105, and translators 104 and 105 assert the corresponding level-translated default bits to the gates of N-channel MOS transistors N83, N84, and N85 of resistor portion R1$_v$ (thereby turning off transistors N83, N84, and N85).

In contrast, when HealCyc is high, NAND gates G7, G8, and G9 assert default "1" bits (rather than control bits PgmWL<1:3>) to voltage level translators 101, 102, and 103, and translators 101, 102, and 103 assert corresponding level-translated default bits to the gates of N-channel MOS transistors N80, N81, and N82 (thereby turning off transistors N80, N81, and N82). Also when HealCyc is high, NAND gates G10 and G11 assert control bits HealWL<1:2> to voltage level translators 104 and 105, and translators 104 and 105 assert the corresponding level-translated control bits to the gates of N-channel MOS transistors N83, N84, and N85 of resistor portion R1$_v$ to control the resistance of resistor portion R1$_v$.

Voltage VPWL (which has a value in a first range of voltages) and supply voltage PlowP__ (which has a value in another range of voltages) are provided to each of voltage level translators 101–105, to enable each translator to perform an appropriate voltage level translation.

A control unit of a memory chip (or other memory system) can control assertion of control words "PgmWL<1:3>" and "HealWL<1:2>" described with reference to FIG. 7, in the manner in which control unit 29 of memory chip 10 of below-discussed FIG. 8 generates such control words. Such a control unit can also assert "HealCyc" (with either a high or low level as described with reference to FIG. 7) at desired times during operation of the memory system.

The resistance of variable resistor portion R2$_v$ is controlled by the control bit output from NOR gate G12, whose value is determined by signals HealCyc and EnWLcomp. Inverter I24 inverts signals HealCyc, and this inverted signal is applied to one input of NOR gate G12. Control signal EnWLcomp is inverted by inverter I26 and supplied to the other input of gate G12. The gate of transistor N78 is connected to the output of gate G12. Thus, the output of gate G12 is a control bit which is low (a logical "0") at all times (thus turning off transistor N78, and causing variable resistor portion $R2_v$ to have a first resistance), other than when both HealCyc and EnWLcomp are high. When both HealCyc and EnWLcomp are high, the output of gate G12 is high (thus turning on transistor N78, and causing variable resistor portion $R2_v$ to have a second resistance lower than the first resistance).

Preferably, the FIG. 7 circuit is designed so that there is a simple functional relation between the binary value of the bits of control word PgmWL<1:3> and the value of VPWL, for a given set of parameters $R1_f$, $R2_f$, $R2_v$, and $V_{ref}$. For example, the binary value of control word PgmWL<1:3> (which is 000, 001, 010, 011, 100, 101, 110, or 111) is desirably linearly related to the value of VPWL in some applications (so that if the binary value of PgmWL<1:3> increases linearly in stepwise fashion, the value of VPWL also increases linearly in stepwise fashion).

FIG. 8 is a block diagram of a flash memory chip 10 which embodies the invention (the memory system of FIG. 8 is an integrated memory circuit). The core of the FIG. 8 system is array 12 of flash memory cells arranged in rows and columns. The operation of chip 10 can be altered using stored control parameters CPN (e.g., control parameters CP1, CP7, CP8, and CP9 stored in data storage units 14A, 14G, 14H, and 14I) which can be altered any time after the chip has been fabricated. Different exemplary memory operations of the chip which can be controlled in this manner are described below.

Control unit 29 of chip 10 includes internal state machine 19, command execution logic 16, other elements shown in FIG. 8, and typically also additional elements (to be discussed) not shown in FIG. 8 for simplicity. State machine 19 controls detailed operations of the system, such as the various individual steps necessary for carrying out programming, reading and erasing operations (e.g., in response to control bits from command execution logic unit 16, which unit 16 has generated by processing command signals such as chip enable signal $\overline{CE}$ and write enable signal $\overline{WE}$). State machine 19 thus functions to reduce the overhead required of an external processor (not depicted) typically used in association with chip 10. Details of control of the operation of state machine 19 are described in above-cited U.S. application Ser. No. 08/508,921 (filed Jul. 28, 1995).

Memory operations, including programming, reading, and erasing can be initiated in various ways. For all operations, the chip enable signal $\overline{CE}$ must be made active (low). In order to perform a read operation, the write enable signal $\overline{WE}$ must also be made inactive (high). For a write operation, signal $\overline{WE}$ must be made active (low). In order to reduce the likelihood of accidental modification of data, erase and program operations require receipt of two consecutive commands that are processed by command execution logic unit 16. The program and erase commands are provided by the associated processor to data I/O terminals DQ0–DQ7, forwarded to input buffer 13, and then forwarded to command execution logic unit 16 for processing.

Memory chip 10 can be permanently configured using stored programmable control parameter CP1 to store either a total of 256K of eight bit words or a total of 128K of sixteen bit words. The control parameter bit (or bits) which determine control parameter CP1 is (are) stored in non-volatile data storage unit 14A. Data storage unit 14A can be of the type described in above-referenced U.S. patent application Ser. No. 08/508,864, entitled NON-VOLATILE DATA STORAGE UNIT AND METHOD OF CONTROLLING SAME, filed Jul. 28, 1995.

Control parameter CP1 is used to control the width of the data bus of chip 10, and thus the size of the data words of the memory. In the present example, the size is either eight bits or sixteen bits. The output of storage unit 14A is connected to I/O control logic unit 15 which controls the memory system input and output functions so as to provide either sixteen bit or eight bit word operation.

In the event the memory has been configured to provide 256k eight bit words (with control parameter CP1 set to provide a eight bit word size), a total of nineteen address bits are provided by the associated processor (not shown in FIG. 8). Eighteen bits of address are received at address terminals A0–A17 of chip 10 and then forwarded to address buffer 17. The last address bit is provided to a DQ15/A-18 terminal. The bit at the DQ15-A-18 terminal is used as the least significant address bit A-18 when the memory is in the eight bit word configuration, and as the I/O DQ15 of the sixteen bit data I/O (DQ0–DQ15) when the memory is in the sixteen bit configuration.

Addresses A0–A17 are forwarded to X decoder 20 and Y decoder 22 to select one sixteen bit word out of array 12. In the event a read operation is being performed, the sixteen data bits read out of array 12 are forwarded to data multiplexer 24. I/O control logic unit 15 directs input buffer 18 to forward address A-18 to multiplexer 24 which will respond by selecting either the lower or higher of the eight bit words of the sixteen bits read from the memory, depending on the state of address bit A-18. The eight bits of output data are forwarded to output buffer 26 which, in turn, couples the output data to memory terminals DQ0–DQ7. In the eight bit mode, the outputs of data output buffer 28, which are connected to terminals DQ8–DQ14, are set to a high impedance state.

If a memory program operation is to be performed when the memory system is in the eight bit mode, the external processor associated with the memory chip provides the eighteen most significant bits of address to terminals A0–A17 and the least significant address bit to terminal DQ15/A-18. The eight bits of data to be programmed at that address are forwarded by the processor to terminals DQ0–DQ7 and then to data input buffer 13. The eight bits of data are then fed to input data latch/multiplexer 30 which selects the eight bits of data from input buffer 13 to be written to either the upper or lower half of the sixteen bits provided to the Y select gate unit 32 based on address A-18.

The eighteen bits of address A0–A17 are used by X decoder 20 and Y decoder 22 to select a sixteen bit word in array 12. Latch/multiplexer 30 further functions to force the deselected eight bits of its output to a disabled state so these bits will not be programmed. Thus, either the upper or lower half of the sixteen bit word addressed by decoders 20 and 22 is programmed with the eight bits of data provided by latch/multiplexer 30. The deselected half is not programmed.

If control parameter CP1 is set so as to provide a sixteen bit word size, the external processor applies eighteen bits of address to terminals A0–A17. If a read operation is to be performed, the eighteen bits of address are used by X decoder 20 and Y decoder 22 to select a sixteen bit word in array 12. Eight bits of the word are forwarded to multiplexer 24 which will forward these bits to output buffer 26 then to terminals DQ0–DQ7. An additional seven bits of the data read from the array 12 are forwarded to output buffer 28 and then to terminals DQ8–DQ14. The sixteenth data bit DQ15 of the word is forwarded to output buffer 34 and then to dual function terminal DQ15/A-18.

In the event a memory program operation is to be performed when the system is in the sixteen bit mode, the eighteen address bits provided by the associated processor to terminals A0–A17 select a sixteen bit word of array 12 to be programmed. The associated processor forwards the sixteen data bits to be programmed to terminals DQ0–DQ7, DQ8–DQ14 and DQ15/A-18. Fifteen of the data bits are received by input buffers 13 and 36. The sixteenth bit is received by input buffer 18. The outputs of buffers 13, 36, and 18 are fed to latch/multiplexer 30 and then forwarded to Y select gates unit 32 to be programmed into the word selected by the eighteen address bits.

Memory chip 10 uses a total of sixteen sense amplifiers, represented by block 33 of FIG. 8, for memory read operations. The sense amplifiers are also used in program verification and in erase verification operations as will be explained later. When signal $\overline{CE}$ is active (low), eight of the sense amplifiers, those associated with DQ0–DQ7, are made active. The output of storage unit 14A is connected to one input of AND gate G1 and the other input of gate G1 receives a control bit from control unit 29. At appropriate times during memory operations, the latter control bit is a "1," causing the output of gate G1 to be indicative of control parameter bit CP1 stored in unit 14A. The output of gate G1 is provided to control logic 15. When output of gate G1 is indicative of bit CP1, control logic 15 operates as follows: when CP1 is set to a "1" indicating eight bit operation, control logic 15 causes the sense amplifiers associated with DQ8–DQ15 to be disabled; and when CP1 is set to a "0" indicating sixteen bit operation, control logic 15 causes all of the sixteen sense amplifiers to be enabled.

As can be seen in FIG. 8, memory array 12 is preferably divided into several memory blocks, including what is commonly referred to as a boot block 12A. The FIG. 8 system is implemented so the memory can be erased in blocks rather than only by a bulk erasure in which the entire memory is erased. Typically, boot block 12A is hardware protected so that it cannot be erased unless special steps are taken. At power on, an external processor associated with chip 10 is typically automatically directed to read the data stored in boot block 12A so that the system can be initialized.

The sense amplifiers within block 33 of FIG. 8 are used in various memory functions, as noted. They are used in memory read operations so that the programmed state of the cells in array 12 can be ascertained. They are also used to verify proper programming of the cells and to verify proper erasure of the cells. In all of these operations, a voltage is developed which is indicative of current flow through the cell being sensed. That sensing voltage is compared to a reference voltage by the sense amplifier. Typically, there will be one reference voltage used in read operations and in program verify operations and another reference voltage used in erase verification operations. An op amp circuit designed in accordance with the invention (e.g., the FIG. 3 circuit or the FIG. 5 circuit) is provided within block 33 of FIG. 8 for asserting a selected output voltage which is used as a reference voltage by one or more of the sense amplifiers in block 33. The variable resistance of such op amp circuit is determined by control bits (e.g., the output of AND gates G2, G3, and G4 of FIG. 8) provided thereto in a manner to be explained below.

In order to more fully appreciate the benefit of using an op amp circuit designed in accordance with the invention in the FIG. 8 embodiment, additional description of the operation of chip 10 may be helpful.

If memory cell array 12 is to be erased (either in bulk or by blocks), the associated processor will cause the output enable $\overline{OE}$ pin to be inactive (high), and the chip enable $\overline{CE}$ and write enable $\overline{WE}$ terminals to be active (low). The processor can then issue an 8 bit command on the data I/O terminals DQ0–DQ7, typically called an Erase Setup command. This is followed by the issuance of a second eight bit command, typically called an Erase Confirm command. Two separate commands are used so as to minimize the possibility of an inadvertent erase operation.

The commands are transferred to data input buffer 13 and then transferred to command execution logic unit 16. Logic unit 16 then instructs state machine 19 to perform all of the numerous and well known steps for erasing array 12. Once the erase sequence is completed, state machine 19 updates an 8 bit status register 25, the contents of which are transferred to data output buffer 26 which is connected to the data I/O terminals DQ0–DQ7 of chip 10. The processor periodically polls the data I/O terminals to read the contents of status register 25 in order to determine whether the erase sequence has been completed and whether it has been completed successfully.

During any erase operation, there is a possibility that one or more cells of array 12 will become what is termed "overerased". The objective of an erase sequence is to erase all the cells of memory array 12 so that the threshold voltages are all within a specified voltage range. That range is typically a small positive voltage range such as +1.5 to +3.0 volts. If the erased cells fall within this range, the cell to be read, the selected or target cell, will produce a cell current in a read operation. The presence of cell current flow indicates that the cell is in an erased state (logic "1") rather than a programmed state (logic "0").

Array 12 includes rows and columns of flash memory cells connected along word lines and bit lines, each cell has a control gate, the control gates of each of the rows of the cells are connected along a different one of the word lines, and each of the columns of the cells is connected along a different one of the bit lines. As mentioned, block 33 includes sense amplifiers. Each of the sense amplifiers is connected (or can be selectively connected) to a selected one of the bit lines.

Cell current is produced in an erased cell because the voltage applied to the control gate, by way of the word line from the array connected to X decoder 20, will exceed the threshold voltage of the erased cell by a substantial amount. In addition, cells which are not being read, the deselected cells, are prevented from producing a cell current even if such cells have been erased to a low threshold voltage state. By way of example, for cells located in the same row as the selected cell, by definition, share the same word line as the selected cell. However, the drains will be floating thereby preventing a cell current from being generated. Deselected cells in the same column will not conduct cell current because the word lines of such deselected cell are typically grounded. Thus, the gate-source voltage of these cells will be insufficient to turn on these deselected cells even if they are in an erased state.

Once array 12 has been erased, the vast majority of cells will have a proper erased threshold voltage. However, it is possible that a few of the cells, or even one, may have responded differently to the erase sequence and such cells have become overerased. If a cell has been overerased, the net charge on the floating gate will be positive. The result will be that the threshold voltage will be negative to some extent. Thus, when the word line connected to such overerased deselected cells is grounded, the deselected cells will nevertheless conduct current. This current will interfere with the reading of the selected cell thereby preventing proper memory operation.

An erase sequence is preferably performed in a manner avoiding such overerasing of cells. An erase sequence is initiated by issuance of the two above-noted erase commands. Once the commands have been received by command execution logic 16, internal state machine 19 first causes all of the cells of array 12 to be programmed. This is done so that all cells are in essentially the same condition when they are subsequently erased. This reduces the likelihood that one or more of the cells will become overerased since all of the cells will have an increased tendency to respond to the subsequent erase sequence in the same manner. Address counter 23 (of FIG. 8) is initialized to the first address of the memory. Next, circuit 21 (of FIG. 8) sets the voltages used for programming to the proper levels, including by asserting (to the appropriate elements of FIG. 8 including decoder circuits 20 and 22) a high voltage. This high voltage can be substantially equal to high voltage $V_{pp}$ during a programming operation, or it can have a value between $V_{pp}$ and close to $V_{ref}$ during a read operation. As noted above, input voltage $V_{ref}$ typically is substantially equal to +2.2 volts. Voltage $V_{pp}$ typically is equal to +12 volts, and is supplied to circuit 21 from an external source.

Once the voltages are set, an internal program pulse counter (not depicted) is initialized. This counter keeps track of the number of programming pulses that have been applied to the cells of the word (byte) being programmed. Next, a programming pulse is applied to the cells of the word located at the first address of the memory. The pulse counter is then incremented and a determination is made as to whether a predetermined maximum number of pulses have been applied to the cells. If that is the case, the cells are read to determine whether the cells have, in fact, been programmed. This is accomplished using the sense amplifiers and associated components represented by block 33 of FIG. 8.

If the cells are still not programmed at this point, there has been a failure since the maximum number of programming pulses has been exceeded. Depending upon the particular memory, the sequence will be terminated or a record of the failed word will be made and the sequence continued. This information will then be transferred to status register 25 (FIG. 8) so that it can be read by the processor. One potential cause of such a failure is that the memory endurance has been exceeded (e.g., the memory has been cycled too many times).

Assuming that the maximum count has not been exceeded, the byte is verified. If the byte has not been programmed, a further programming pulse is applied and the counter is incremented. Assuming that the maximum count has still not been exceeded, the byte is again verified. This sequence will continue until the byte finally passes the verification test or until the pulse counter is at the maximum.

Assuming that the first byte is eventually successfully programmed, a determination is made as to whether the last address of array 12 has been programmed. If that is not the case, address counter 23 is incremented to the second address and the internal pulse counter reset. A first programming pulse is applied to the byte of the second address and the sequence is repeated. This process will continue until all cells of array 12 have either been programmed or until a determination is made that there is a programming failure.

Assuming that all of the cells have been successfully programmed and verified, state machine 19 will continue the erase sequence by setting the appropriate voltages used for erasing, including the initialization of address counter 23 and the setup of the appropriate voltages for erasing, including voltage $V_{pp}$.

Next, an internal erase pulse counter is reset and a single erase pulse is applied to all of the cells of the array (or to the block of the array being erased). The cells of array 12 will then be sequentially read in order to determine whether all cells have been successfully erased. First, the conditions necessary for erase verification, namely those for cell reading, are set up and the first cell of array 12 is read.

A single erase pulse is almost never sufficient to accomplish an erasure so that this test will almost always fail. The state of the erase pulse counter is then examined and a determination is made that the maximum count has not been exceeded. Accordingly, a second erase pulse is applied to the entire array 12 and the first byte is again tested.

Once the byte has received a sufficient number of erase pulses and has passed the verification test, the address is incremented and the second byte is tested to determine whether the second byte has been successfully erased. Since the cells are not always uniform, it is possible that the second byte has not been erased even though it has received the same number of erase pulses received by the first byte. In that event, a further erase pulse is applied to the entire array 12 and the second byte is again tested for a proper erase. Note that the address is not reset at this point since it is not necessary to retest those bytes that have already been erased. However, there is a possibility that those earlier erased bytes will become overerased, as will be explained.

Once it has been established that the second byte has been properly erased, a determination is made as to whether the last address of the array has been verified. If that is not the case, address counter 23 is incremented and the third byte is tested. Additional erase pulses will be applied if necessary. The internal erase pulse counter monitors the total number of erase pulses applied in the erase sequence. If a maximum number has been exceeded, the sequence is terminated and one of the bits of status register 25 is set to reflect that an erase error has occurred.

Assuming that the second byte of cells has been properly erased, the remaining bytes will be verified and any necessary additional erase pulses will be applied. Once the last address has been verified, the erase sequence is ended and status register 25 is updated to indicate that the erase sequence has been successfully completed.

Many memory systems are capable of performing operations for reducing the distribution of the erased threshold voltages and for correcting cells which have been overerased. One such process is sometimes referred to as a heal operation. In a heal operation, the bit lines of array 12 are left open and the source lines of array 12 are grounded. A high voltage, typically +12 volts, is applied to all of the word lines of array 12. The high voltage is applied in the form of a pulse, with the heal operation typically requiring application of multiple pulses. These conditions cause electrons to be transferred to the floating gates of all of the cells of the array thereby increasing the threshold voltage. Cells which have been overerased will have a higher amount of charge transferred to them so that their threshold voltage will be increased more than the other cells. This process will move the overerased threshold voltage from a negative value to a positive value. Since the cells having negative threshold voltages (overerased cells) and those having small positive threshold voltages will be affected more than other cells, this process will have a tendency to reduce the voltage distribution of all of the cells and to correct for the overerased cells.

As previously described, the sense amplifiers in block 33 of FIG. 8 are used for sensing voltages indicative of flash memory cell current under different operating conditions. The present invention enables the various reference voltages used by the sense amplifiers (for comparison to the sensed voltages) to be adjusted or trimmed in an improved manner after memory chip fabrication is completed. Thus, it is possible to optimize these reference voltages to take into account the particular characteristics of the memory system as determined after fabrication.

FIG. 9 is an example of circuitry (described in above-referenced U.S. patent application Ser. No. 08/508,923, filed Jul. 28, 1995) which could be used (rather than the present invention) to control the reference voltage used by sense amplifier 120 of FIG. 9. FIG. 9 assumes that sense amplifier 120 is one of the sense amplifiers in block 33 of FIG. 8 and that cell 122 is one of the memory cells of array 12 of FIG. 8. The FIG. 9 circuit can be programmed (by storing control bits in data storage units 14C, 14D, 14E, and 14F) to produce either one of two reference voltages for use by sense amplifier 120. The first reference voltage is for use when the memory cells of array 12 are being read in a normal read operation and as part of a programming operation to confirm that the cells have been properly programmed (program verification). This voltage (produced in response to control bits from storage units 14C and 14D) is referred to as the sense trim reference voltage and is applied to the inverting input of sense amplifier 120. The other reference voltage (produced in response to control bits from storage units 14E and 14F) is used in erase operations, and is referred to as the erase trim reference voltage.

With reference to FIG. 9, in the read mode, the word line connected to the gate of the cell (cell 122) being read is connected to +5.5 volts. If the cell has been programmed, the word line voltage is below the programmed threshold voltage of the cell and essentially no cell current will flow. If the cell is in an erased state, the word line voltage exceeds the threshold voltage and significant cell current will flow. The cell current (at the noninverting input of sense amplifier 120) is converted to a corresponding voltage which is compared with the sense trim reference voltage (being applied to the inverting input of sense amplifier 120).

The sense trim reference voltage is also applied to the inverting input of sense amplifier 120 when cell 122 (the cell in array 12 which is addressed by address counter 23) is being read as part of a program verification. However, in this case the word line voltage applied to the cell being read is increased to about +7.5 volts, a level which exceeds the programmed threshold voltage. This causes cell 122 to conduct a current indicative of the programmed threshold voltage level. This cell current (applied to the non-inverting input of sense amplifier 120) is converted to a corresponding voltage which is compared with the sense trim reference voltage at the inverting input of sense amplifier 120.

In the event an erase verification is to take place, an erase trim reference voltage is applied to the inverting input of sense amplifier 120. A word line voltage of typically +5.5 volts is applied to the control gates of each cell 122 being verified. This will result in a cell current indicative of the erased threshold voltage of the cells. The cell current is converted to a voltage which is compared by sense amplifier 120 to the erase trim reference voltage.

Each of the erase and sense trim reference voltages can be adjusted by controlling the state of two programmable control parameters. The level of the sense trim reference voltage is adjusted using control parameter bits CP3 and CP4 stored in non-volatile data storage units 14C and 14D, respectively. The erase trim reference voltage is adjusted using control parameter bits CP5 and CP6 stored in non-volatile data storage units 14E and 14F, respectively.

Bits CP3 and CP4 are coupled to sense trim multiplexer 109. When multiplexer 109 is enabled during read and program verification operations, multiplexer 109 uses bits CP3 and CP4 to enable one of four possible outputs. An enabled multiplexer output (of either multiplexer 109, or multiplexer 111 to be discussed below) is set to a high level and a disabled output is set to a low level. When a read or a program verification is taking place, erase trim multiplexer 111 is disabled so that all four of the multiplexer 111 outputs are at a low (disabled) state.

A selected one of four N-channel transistors 112A–112D is turned on by the selected output of multiplexer 109 depending upon the state of parameters CP3 and CP4 (received in parallel by multiplexer 109). Transistors 112A–112D are connected to various nodes of a resistive divider which includes resistors 110A–110F connected in series between a supply voltage $V_{cc}$ and the memory common. The magnitude of the voltage at node 115 of the resistive divider can thus be altered depending upon which one of transistors 112A–112D is made conductive by circuit 109 in response to control parameters CP3 and CP4. Depending upon the relative sizes of resistors 110A–110F, the control parameters can function to provide a very small but accurate trim or a larger but less accurate trim in the voltage at node 115.

The voltage at node 115 is connected to the control gate of reference flash cell 116. Flash cell 116 is set to a U.V. erased state so that there is no net charge present on the cell's floating gate. Load 118 is connected between the drain of reference cell 116 and a node held at voltage $V_D$. Node 117 between load 118 and the drain of cell 116 is connected to the inverting input of sense amplifier 120.

When cell 122 is being read, the control gate (word line) voltage of the cell is set to +5.5 volts, which will exceed the threshold voltage of an erased cell, but will not exceed the threshold voltage of a programmed cell. Node 123 is between the drain of cell 122 and load 124, and load 124 is connected between node 123 and a node held at voltage $V_D$. The voltage at node 123 will be less than or greater than one of two levels depending upon whether cell 122 is erased or programmed. The reference voltage at node 117 is set midway between these two levels utilizing control parameters CP3 and CP4 so as to maximize the margin between the sense level and the erased or programmed cell when the cell is read by sense amplifier 120.

When cell 122 is being verified for programming, the sense voltage at node 117 will be the same as in the read operation. However, as previously noted, word line voltage applied to cell 122 is set to a large value (+7.5 volts) so that the programmed cell, which has a high threshold voltage, will conduct a current. This current will result in a voltage change at node 123 depending upon the programmed threshold voltage of the cell. The trimmed sense reference current flowing at node 117 is set to a level to correspond to some maximum amount of programmed cell 122 current. Thus, sense amplifier 120's output will go high if the cell being verified has not been adequately programmed.

When an erase verification operation is taking place, sense trim multiplexer 109 is disabled so that all four transistors 112A–112D are turned off, and a selected one of the outputs of erase trim multiplexer 111 is turned on depending on the state of control parameter bits CP5 and CP6 (which are supplied in parallel from units 14E and 14F to multiplexer 111). This causes a selected one of four N channel transistors 114A–114D to turn on thereby changing the voltage at node 115 of the resistive divider. This causes the erase trim voltage at node 117 to be altered based upon the parameters CP5 and CP6.

An erased cell 122 being verified will conduct a cell current since the voltage applied to the word line, +5.5 volts will exceed the erased threshold voltage. The resultant cell current will be indicative of the erased threshold voltage of the cell, with such current resulting in a drop in voltage on node 123. If node 123 drops below the magnitude of the erase trim reference voltage at node 117, the cell has been adequately erased and the output of sense amplifier 120 will go low. Although two control parameters are used for adjusting each of the sense trim reference voltage and the erase trim reference voltage, three or more parameters could be used for this purpose (e.g., to increase the adjust range).

The present invention provides an improved circuit (to replace a circuit of the type shown in FIG. 9 circuit) for controlling the reference voltage used by a sense amplifier within block 33 of FIG. 8. In the FIG. 8 embodiment of the invention, the inventive op amp circuit (e.g., the FIG. 5 circuit with the "complementary portion" of the FIG. 3 circuit) and elements 14G, 14H, 14I, and G2, G3, and G4 of FIG. 8 are employed (rather than elements 14C–14F, 109, 110A–110F, 111, 112A–112D, 114A–114D, 116, and 118 of FIG. 9) to control the reference voltage used by at least one sense amplifier (e.g., sense amplifier 120 of FIG. 9) in block 33 of FIG. 8. In the FIG. 8 embodiment, the op amp circuit (e.g., the FIG. 5 circuit with the "complementary portion" of the FIG. 3 circuit) is within block 33, and an identical op amp circuit is within block 21.

With reference to FIG. 8, the output of storage unit 14G is fed to one input of AND gate G2, the output of storage unit 14H is fed to one input of AND gate G3, and the output of storage unit 14I is fed to one input of AND gate G4. The other input of each of gates G2, G3, and G4 receives a control bit from control unit 29. At appropriate times during memory operations, control unit 29 asserts the control bit with a value of "1," causing the output of gate G2 to be indicative of control parameter bit CP7 stored in unit 14G, the output of gate G3 to be indicative of control parameter bit CP8 stored in unit 14H, and the output of gate G4 to be indicative of control parameter bit CP9 stored in unit 14I. At times when control unit 29 asserts the control bit with a value of "0," the output of gates G2, G3, and G4 (three "0" bits asserted in parallel) is a default value. In variations on the memory chip of FIG. 8 embodiment, gates G2, G3, and G4 are omitted, and control parameter bits CP7, CP8, and CP9 are asserted in parallel to block 33 at all times during operation of the memory chip.

The three control parameter bits CP7, CP8, and CP9 bits output (in parallel) from storage units 14G, 14H, and 14I are the three parallel bits of control word CTRL<2:0> of FIG. 5, or the three parallel bits of control word PgmWL<1:3> of FIG. 7 (or two of bits CP7, CP8, and CP9 are the two parallel bits of control word HealWL<1:2> of FIG. 7). The three control parameter bits CP7, CP8, and CP9 bits asserted by gates G2, G3, and G4 to block 33 are processed by the op amp circuit in block 33 of FIG. 8 in the same way as the FIG. 5 circuit processes the bits of control word CTRL<2:0> or the FIG. 7 circuit processes the bits of control word PgmWL<1:3> or HealWL<1:2>. Thus, by programming storage units 14G, 14H, and 14I with a set of binary bits, and then asserting these bits to the op amp circuit (within block 33) at an appropriate time (e.g., in response to a control bit asserted from control unit 29 to gates G2, G3, and G4), a particular value of variable resistance R1$_v$ is determined. The op amp circuit asserts an output voltage, $V_{out}$=[(R2+ R1$_f$+R1$_v$)V$_{ref}$]/R2, in response to this value of variable resistance R1$_v$. This output voltage $V_{out}$ is provided to the inverting input of sense amplifier 120.

Preferably, memory chip 10 of FIG. 8 includes reference voltage generation circuitry of the type described in U.S. patent application Ser. No. 08/509,737, entitled REFERENCE VOLTAGE GENERATOR USING FLASH MEMORY CELLS, filed Aug. 1, 1995 (and assigned to the assignee of the present application (the full text of said U.S. application Ser. No. 08/509,737 is incorporated herein by reference), and this reference voltage generation circuitry is employed by memory chip 10 to generate input voltage $V_{ref}$ mentioned in the previous paragraph.

The control bits CP7, CP8, and CP9 output from gates G2, G3, and G4 are also asserted to the op amp circuit within circuit 21. In an embodiment in which the op amp circuit within circuit 21 has the design shown in FIG. 7, these three control bits correspond to the three bits of control word PgmWL<1:3> (shown in FIG. 7). Circuit 21 of FIG. 8 receives high voltage $V_{pp}$ from an external source, and asserts a high voltage VPWL (substantially equal to $V_{pp}$) to elements of FIG. 8 when enabled by a control signal from state machine 19. Typically, $V_{pp}$ is 12 volts. In operation, the described embodiment of the inventive op amp circuit within circuit 21 enables control of high voltage VPWL (the output voltage of circuit 21) in response to control bits CP7, CP8, and CP9. By varying the binary value of the three control bits CP7, CP8, and CP9 (considered as a three-bit word consisting of CP7, CP8, and CP9 concatenated together), the value of the output voltage of circuit 21 can be varied.

In a variation of the FIG. 8 embodiment, the FIG. 3 embodiment of the inventive op amp circuit is included within block 33, and five data storage units (rather than the three storage units 14G, 14H, and 14I of FIG. 8) provide the five bits of control word TRIM<4:0> to this op amp circuit. Thus, by programming these five storage units with a set of binary bits, and then asserting these bits to the op amp circuit (within block 33) at an appropriate time (e.g., in response to a control bit asserted from control unit 29), a particular value of variable resistance R2$_v$ is determined.

Preferred embodiments of the invention have been described with reference to FIGS. 1–8. Although several preferred embodiments have been described in some detail, it is contemplated that changes from each embodiment can be made without departing from the spirit and scope of the invention as defined by the appended claims.

What is claimed is:

1. An operational amplifier-based voltage multiplier circuit implemented as an integrated circuit, including:

an op amp having a first input for receiving an input voltage, a second input for receiving a second voltage, and an output which asserts an output voltage in response to the input voltage and the second voltage;

a feedback circuit, having a feedback resistance, connected between the output and the second input; and an input circuit, having an input resistance, connected between ground and the second input, wherein at least one of the feedback circuit and the input circuit receives a set of control bits, at least one of the feedback resistance and the input resistance is a variable resistance determined by the set of control bits, the feedback resistance and the input resistance determine a selected value $V_{out}$ of the output voltage for each value $V_{ref}$ of the input voltage, each said value $V_{out}$ satisfies $V_{out}$=(K)(V$_{ref}$), where K is a factor determined by the feedback resistance and the input resistance, and the set of control bits determines a binary control word whose binary value has a simple functional relation to the selected value $V_{out}$ of the output voltage.

2. The circuit of claim 1, wherein the input resistance is the variable resistance, and wherein the input circuit includes:

a set of resistors connected in series between the second input and ground; and a set of at least one transistor having channel terminals connected in parallel with at least a subset of the set of resistors, wherein a gate of each said transistor receives one of the control bits.

3. The circuit of claim 2, wherein the set of resistors is a first set of transistors whose channel terminals are connected in series between the second input and ground.

4. An operational amplifier-based voltage multiplier circuit implemented as an integrated circuit, including:

an op amp having a first input for receiving an input voltage, a second input for receiving a second voltage, and an output for asserting an output voltage;

a feedback circuit, having a feedback resistance, connected between the output and the second input; and an input circuit, having an input resistance, connected between ground and the second input, wherein at least one of the feedback circuit and the input circuit receives a set of control bits, the input resistance is a variable resistance determined by the set of control bits, the feedback resistance and the variable resistance determine a selected value of the output voltage for each value of the input voltage, and the set of control bits determines a binary control word whose binary value has a simple functional relation to the selected value of the output voltage, and wherein the input circuit includes:

a set of resistors connected in series between the second input and ground; and a set of at least one transistor having channel terminals connected in parallel with at least a subset of the set of resistors, wherein a gate of each said transistor receives one of the control bits, wherein the set of resistors is a first set of transistors whose channel terminals are connected in series between the second input and ground, and wherein the set of at least one transistor includes at least two transistors having channel terminals connected in parallel with the channel terminals of at least a subset of the first set of transistors.

5. The circuit of claim 2, wherein the set of resistors is a set of passive resistors connected in series between the second input and ground.

6. An operational amplifier-based voltage multiplier circuit implemented as an integrated circuit, including:

an op amp having a first input for receiving an input voltage, a second input for receiving a second voltage, and an output for asserting an output voltage;

a feedback circuit, having a feedback resistance, connected between the output and the second input; and an input circuit, having an input resistance, connected between ground and the second input, wherein at least one of the feedback circuit and the input circuit receives a set of control bits, the input resistance is a variable resistance determined by the set of control bits, the feedback resistance and the variable resistance determine a selected value of the output voltage for each value of the input voltage, and the set of control bits determines a binary control word whose binary value has a simple functional relation to the selected value of the output voltage, and wherein the input circuit includes:

a set of resistors connected in series between the second input and ground; and a set of at least one transistor having channel terminals connected in parallel with at least a subset of the set of resistors, wherein a gate of each said transistor receives one of the control bits, wherein the set of resistors includes a first resistor having a first resistance, a second resistor having a second resistance, and a third resistor having a third resistance, and wherein the third resistance is substantially twice the second resistance and the second resistance is substantially twice the first resistance.

7. An operational amplifier-based voltage multiplier circuit implemented as an integrated circuit, including:

an op amp having a first input for receiving an input voltage, a second input for receiving a second voltage, and an output for asserting an output voltage;

a feedback circuit, having a feedback resistance, connected between the output and the second input; and an input circuit, having an input resistance, connected between ground and the second input, wherein at least one of the feedback circuit and the input circuit receives a set of control bits, the input resistance is a variable resistance determined by the set of control bits, the feedback resistance and the variable resistance determine a selected value of the output voltage for each value of the input voltage, and the set of control bits determines a binary control word whose binary value has a simple functional relation to the selected value of the output voltage, wherein the variable resistance has a sequence of different values in response to a sequence of different sets of control bits received at the input circuit, each of the values of the variable resistance determines a different value of the output voltage for a fixed value of the input voltage, and the sets of control bits determine binary control words having binary values which are related inversely proportionally to the values of the output voltage.

8. The circuit of claim 7, wherein each of the sets of control bits consists of N binary bits, and the sets of control bits determine $2^N$ different binary control words.

9. The circuit of claim 7, wherein the input circuit includes:

a first set of resistors connected in series between the second input and ground; and a second set of series-connected transistors having channel terminals connected in parallel with at least a subset of the first set of resistors, wherein for each of the sets of control bits, a gate of each of the transistors in the second set receives one of the control bits of said each of the sets of control bits.

10. An operational amplifier-based voltage multiplier circuit implemented as an integrated circuit, including:

an op amp having a first input for receiving an input voltage, a second input for receiving a second voltage, and an output for asserting an output voltage;

a feedback circuit, having a feedback resistance, connected between the output and the second input; and an input circuit, having an input resistance, connected between ground and the second input, wherein at least one of the feedback circuit and the input circuit receives a set of control bits, at least one of the feedback resistance and the input resistance is a variable resistance determined by the set of control bits, the feedback resistance and the variable resistance determine a selected value of the output voltage for each value of the input voltage, and the set of control bits determines a binary control word whose binary value has a simple functional relation to the selected value of the output voltage, wherein at least one of the input circuit and the feedback circuit includes:

a selection circuit connected to receive simultaneously at least two sets of control bits and configured to select one of the sets of control bits and to provide the selected one of the sets of control bits to said at least one of the feedback circuit and the input circuit, wherein the selected one of the sets of control bits determines the variable resistance.

11. The circuit of claim 10, wherein the input resistance is the variable resistance, the input circuit includes the selection means, and the input circuit also includes:

a first set of resistors connected in series between the second input and ground; and a second set of series-connected transistors having channel terminals connected in parallel with at least a subset of the first set of resistors, wherein a gate of each of the transistors in the second set receives one of the control bits of said selected one of the sets of control bits.

12. The circuit of claim 1, wherein the feedback resistance is the variable resistance, and wherein the feedback circuit includes:

a set of resistors connected in series between the second input and the output; and a second set of at least one transistor having channel terminals connected in parallel with at least a subset of the set of resistors, wherein a gate of each transistor in the second set receives one of the control bits.

13. An operational amplifier-based voltage multiplier circuit implemented as an integrated circuit, including:

an op amp having a first input for receiving an input voltage, a second input for receiving a second voltage, and an output for asserting an output voltage;

a feedback circuit, having a feedback resistance, connected between the output and the second input; and an input circuit, having an input resistance, connected between ground and the second input, wherein at least one of the feedback circuit and the input circuit receives a set of control bits, the feedback resistance is a variable resistance determined by the set of control bits, the input resistance and the variable resistance determine a selected value of the output voltage for each value of the input voltage, and the set of control bits determines a binary control word whose binary value has a simple functional relation to the selected value of the output voltage, and wherein the feedback circuit includes:

a set of resistors connected in series between the second input and the output; and a second set of at least one transistor having channel terminals connected in parallel with at least a subset of the set of resistors, wherein a gate of each transistor in the second set receives one of the control bits, wherein the set of resistors is a first set of transistors whose channel terminals are connected in series between the second input and the output, and at least one transistor in the second set has channel terminals connected in parallel with the channel terminals of at least a subset of the first set of transistors.

14. The circuit of claim 13, wherein the second set includes at least two transistors having channel terminals connected in parallel with the channel terminals of at least a subset of the first set of transistors.

15. An operational amplifier-based voltage multiplier circuit implemented as an integrated circuit, including:

an op amp having a first input for receiving an input voltage, a second input for receiving a second voltage, and an output for asserting an output voltage;

a feedback circuit, having a feedback resistance, connected between the output and the second input; and an input circuit, having an input resistance, connected between ground and the second input, wherein at least one of the feedback circuit and the input circuit receives a set of control bits, the feedback resistance is a variable resistance determined by the set of control bits, the input resistance and the variable resistance determine a selected value of the output voltage for each value of the input voltage, and the set of control bits determines a binary control word whose binary value has a simple functional relation to the selected value of the output voltage, and wherein the feedback circuit includes:

a set of resistors connected in series between the second input and the output; and a second set of at least one transistor having channel terminals connected in parallel with at least a subset of the set of resistors, wherein a gate of each transistor in the second set receives one of the control bits, wherein the set of resistors includes a first resistor having a first resistance, a second resistor having a second resistance, and a third resistor having a third resistance, and wherein the third resistance is substantially twice the second resistance and the second resistance is substantially twice the first resistance.

16. An operational amplifier-based voltage multiplier circuit implemented as an integrated circuit, including:

an op amp having a first input for receiving an input voltage, a second input for receiving a second voltage, and an output for asserting an output voltage;

a feedback circuit, having a feedback resistance, connected between the output and the second input; and an input circuit, having an input resistance, connected between ground and the second input, wherein at least one of the feedback circuit and the input circuit receives a set of control bits, the feedback resistance is a variable resistance determined by the set of control bits, the feedback resistance and the variable resistance determine a selected value of the output voltage for each value of the input voltage, and the set of control bits determines a binary control word whose binary value has a simple functional relation to the selected value of the output voltage, wherein the variable resistance has a sequence of different values in response to a sequence of different sets of control bits received at the feedback circuit, each of the values of the variable resistance determines a different value of the output voltage for a fixed value of the input voltage, and the sets of control bits determine binary control words having binary values which are linearly related to the values of the output voltage.

17. The circuit of claim 16, wherein the feedback circuit includes:

a first set of resistors connected in series between the second input and the output; and a second set of series-connected transistors having channel terminals connected in parallel with at least a subset of the first set of resistors, wherein for each of the sets of control bits, a gate of each of the transistors in the second set receives one of the control bits of said each of the sets of control bits.

18. An operational amplifier-based voltage multiplier circuit implemented as an integrated circuit, including:

an op amp having a first input for receiving an input voltage, a second input for receiving a second voltage, and an output for asserting an output voltage;

a feedback circuit, having a feedback resistance, connected between the output and the second input; and an input circuit, having an input resistance, connected between ground and the second input, wherein at least one of the feedback circuit and the input circuit receives a set of control bits, the feedback resistance is a variable resistance determined by the set of control bits, the feedback resistance and the variable resistance determine a selected value of the output voltage for each value of the input voltage, and the set of control bits determines a binary control word whose binary value has a simple functional relation to the selected value of the output voltage, wherein the feedback circuit includes:

a selection circuit connected to receive simultaneously at least two sets of control bits and configured to select one of the sets of control bits and to provide the selected one of the sets of control bits to said at least one of the feedback circuit and the input circuit, wherein the selected one of the sets of control bits determines the variable resistance.

19. The circuit of claim 18, wherein the feedback circuit includes:

a first set of transistors whose channel terminals are connected in series between the second input and ground; and a second set of series-connected transistors having channel terminals connected in parallel with the channel terminals of the first set of transistors between the second input and ground, wherein a gate of each of the transistors in the second set receives one of the control bits of said selected one of the sets of control bits.

20. The circuit of claim 1, wherein the input resistance is a first variable resistance, the feedback resistance is a second variable resistance, and the input circuit includes:

a first set of resistors connected in series between the second input and ground; and a second set of at least one transistor having channel terminals connected in parallel with at least a subset of the first set of resistors, wherein a gate of each transistor in the second set receives one of the control bits.

21. The circuit of claim 20, wherein the feedback circuit includes:

a third set of resistors connected in series between the second input and the output; and a fourth set of at least one transistor having channel terminals connected in parallel with at least a subset of the third set of resistors, wherein a gate of each transistor in the fourth set receives one of the control bits.

22. The circuit of claim 1, wherein the output voltage does not depend on variations in a supply voltage supplied to the circuit.

23. The circuit of claim 22, wherein the output voltage has a value in a range from the input voltage to said supply voltage.

24. A memory system implemented as an integrated circuit, including:

an array of memory cells;

control means for generating control signals for controlling operations of the system, said operations including programming the memory cells and reading the memory cells; and an operational amplifier-based voltage multiplier circuit, wherein the operational amplifier-based voltage multiplier circuit includes:

an op amp having a first input for receiving an input voltage, a second input for receiving a second voltage, and an output for asserting an output voltage for use in at least one memory operation of the system;

a feedback circuit, having a feedback resistance, connected between the output and the second input; and an input circuit, having an input resistance, connected between ground and the second input, wherein at least one of the feedback circuit and the input circuit receives a set of control bits in response to the control means, wherein at least one of the feedback resistance and the input resistance is a variable resistance determined by the set of control bits, and wherein the variable resistance determines a selected value of the output voltage for each value of the input voltage, wherein the set of control bits determines a binary control word whose binary value has a simple functional relation to the selected value of the output voltage.

25. The system of claim 24, wherein the memory array includes rows and columns of the cells, and wherein the system also includes:

at least one sense amplifier for reading at least a selected one of the cells, wherein the sense amplifier is connected to the output of the op amp and receives the output voltage from said output of the op amp.

26. The system of claim 24, wherein the memory array includes rows and columns of the cells, with each cell in one of the rows being coupled to a common word line, wherein the system also includes:

means for connecting the output of the op amp to said word line.

27. The system of claim 24, also including:

a set of non-volatile data storage units, wherein each of the storage units stores one of the control bits.

28. The system of claim 27, wherein the non-volatile data storage units assert the control bits to said at least one of the feedback circuit and the input circuit under control of the control means.

29. The system of claim 24, also including:

means for asserting a selected voltage to selected ones of the cells, wherein the op amp is connected to said means for asserting the selected voltage, the output voltage of the op amp is asserted to said means for asserting the selected voltage, and said output voltage of the op amp is substantially equal to said selected voltage.

30. The system of claim 24, wherein the input resistance is the variable resistance, and wherein the input circuit includes:

a first set of resistors connected in series between the second input and ground; and a second set of at least one transistor having channel terminals connected in parallel with at least a subset of the first set of transistors, wherein a gate of each transistor in the second set receives one of the control bits.

31. The system of claim 30, wherein the second set includes at least two series-connected transistors whose channel terminals are connected in parallel with at least a subset of the first set of resistors.

32. The system of claim 24, wherein the input resistance is the variable resistance, the variable resistance has a sequence of different values in response to a sequence of different sets of control bits received at the input circuit, each of the values of the variable resistance determines a different value of the output voltage for a fixed value of the input voltage, and the sets of control bits determine binary control words having binary values which are related inversely proportionally to the values of the output voltage.

33. The system of claim 24, wherein at least one of the input circuit and the feedback circuit includes:

selection means for simultaneously receiving at least two sets of control bits and selecting one of the sets of control bits, wherein the selected one of the sets of control bits determines the variable resistance.

34. The system of claim 33, wherein the input resistance is the variable resistance, the input circuit includes the selection means, and the input circuit also includes:

a first set of resistors connected in series between the second input and ground; and a second set of transistors having channel terminals connected in parallel with at least a subset of the first set of resistors, wherein a gate of each of the transistors in the second set receives one of the control bits of said selected one of the sets of control bits.

35. The system of claim 34, wherein the second set includes at least two transistors having channel terminals connected in parallel with at least a subset of the first set of resistors.

36. The system of claim 24, wherein the feedback resistance is the variable resistance, and wherein the feedback circuit includes:

a first set of resistors connected in series between the second input and the output; and a second set of at least one transistor whose channel terminals are connected in parallel with at least a subset of the first set of resistors, wherein a gate of each transistor in the second set receives one of the control bits.

37. The system of claim 36, wherein the second set includes at least two transistors having channel terminals connected in parallel with at least a subset of the first set of resistors.

38. A method for controlling a voltage multiplier circuit implemented as an integrated circuit, said voltage multiplier circuit including an op amp having a first input for receiving an input voltage, a second input for receiving a second voltage, and an output which asserts an output voltage in response to the input voltage and the second voltage, said voltage multiplier circuit also including a feedback circuit, having a feedback resistance, connected between the output and the second input, and said voltage multiplier circuit also including an input circuit, having an input resistance, connected between ground and the second input, said method including the step of:

providing a set of control bits to at least one of the feedback circuit and the input circuit, wherein at least one of the feedback resistance and the input resistance is a variable resistance determined by the set of control bits, the feedback resistance and the input resistance determine a selected value $V_{out}$ of the output voltage for each value $V_{ref}$ of the input voltage, each said value $V_{out}$ satisfies $V_{out}=(K)(V_{ref})$, where K is a factor determined by the feedback resistance and the input resistance, and the set of control bits determines a binary control word whose binary value has a simple functional relation to the selected value $V_{out}$ of the output voltage.

39. The method of claim 38, wherein the input resistance is the variable resistance, and also including the step of:

asserting a sequence of different sets of control bits to the input circuit, wherein the variable resistance has a sequence of different values in response to said sequence of different sets of control bits, each of the values of the variable resistance determines a different value of the output voltage for a fixed value of the input voltage, and the sets of control bits determine binary control words having binary values which are related inversely proportionally to the values of the output voltage.

40. The method of claim 39, wherein each of the sets of control bits consists of N binary bits, and the sets of control bits determine $2^N$ different binary control words.

41. The method of claim 38, wherein the feedback resistance is the variable resistance, and also including the step of:

asserting a sequence of different sets of control bits to the feedback circuit, wherein the variable resistance has a sequence of different values in response to said sequence of different sets of control bits, each of the values of the variable resistance determines a different value of the output voltage for a fixed value of the input voltage, and the sets of control bits determine binary control words control word having binary values which are linearly related to the values of the output voltage.

42. A method for operating a memory system implemented as an integrated circuit, said memory system including an array of memory cells, and a voltage multiplier circuit including an op amp having a first input for receiving an input voltage, a second input for receiving a second voltage, and an output for asserting an output voltage for use in at least one memory operation of the system, said voltage multiplier circuit also including a feedback circuit, having a feedback resistance, connected between the output and the second input, and said voltage multiplier circuit also including an input circuit, having an input resistance, connected between ground and the second input, said method including the steps of:

generating control signals for controlling operations of the system, said operations including programming the memory cells and reading the memory cells; and asserting a set of the control signals to at least one of the feedback circuit and the input circuit, wherein at least one of the feedback resistance and the input resistance is a variable resistance determined by the set of control bits, and wherein the variable resistance determines a selected value of the output voltage for each value of the input voltage, wherein the set of control bits determines a binary control word whose binary value has a simple functional relation to the selected value of the output voltage.

43. The method of claim 42, wherein the memory array includes rows and columns of the cells, the system includes at least one sense amplifier for reading at least a selected one of the cells, and the method also includes the steps of:

asserting the output voltage to the sense amplifier from the output of the op amp.

44. The method of claim 42, wherein the input resistance is the variable resistance, and wherein said method also includes the step of:

asserting a sequence of different sets of the control bits to the input circuit, wherein the variable resistance has a sequence of different values in response to said sequence of different sets of the control bits, each of the values of the variable resistance determines a different value of the output voltage for a fixed value of the input voltage, and the sets of control bits determine binary control words having binary values which are related inversely proportionally to the values of the output voltage.

45. The method of claim 42, wherein the feedback resistance is the variable resistance, said method also including the step of:

asserting a sequence of different sets of the control bits to the feedback circuit, wherein the variable resistance has a sequence of different values in response to said sequence of different sets of control bits, each of the values of the variable resistance determines a different value of the output voltage for a fixed value of the input voltage, and the sets of control bits determine binary control words having binary values which are linearly related to the values of the output voltage.

* * * * *